United States Patent
Kano et al.

(10) Patent No.: US 9,620,196 B2
(45) Date of Patent: Apr. 11, 2017

(54) RECEPTION CIRCUIT, METHOD FOR ADJUSTING TIMING IN RECEPTION CIRCUIT, AND SEMICONDUCTOR DEVICE

(71) Applicant: SOCIONEXT INC., Yokohama-shi, Kanagawa (JP)

(72) Inventors: Hiroyuki Kano, Yokohama (JP); Takanori Aoshima, Kasugai (JP); Hiroaki Ukai, Nagoya (JP); Kazumi Kojima, Ichinomiya (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/161,006

(22) Filed: May 20, 2016

(65) Prior Publication Data

US 2016/0351245 A1 Dec. 1, 2016

(30) Foreign Application Priority Data

May 28, 2015 (JP) ................................ 2015-108644

(51) Int. Cl.
| | | |
|---|---|---|
| G11C 7/00 | (2006.01) | |
| G11C 11/4076 | (2006.01) | |
| G11C 11/4096 | (2006.01) | |
| G11C 11/4093 | (2006.01) | |

(52) U.S. Cl.
CPC ...... *G11C 11/4076* (2013.01); *G11C 11/4093* (2013.01); *G11C 11/4096* (2013.01)

(58) Field of Classification Search
CPC ........ G11C 7/22; G11C 7/1066; G11C 7/1051
USPC .......................... 365/193, 189.05, 233.1, 194
See application file for complete search history.

(56) References Cited

U.S. PATENT DOCUMENTS

| | | | | |
|---|---|---|---|---|
| 7,164,601 B2 * | 1/2007 | Mitani | ............. | G11C 11/56 |
| | | | | 365/185.03 |
| 2013/0064025 A1 | 3/2013 | Chen et al. | | |
| 2013/0173966 A1 | 7/2013 | Nakabayashi et al. | | |

FOREIGN PATENT DOCUMENTS

| | | |
|---|---|---|
| JP | 2012-27734 A | 2/2012 |
| JP | 2012-58997 A | 3/2012 |
| JP | 2013-58209 A | 3/2013 |

* cited by examiner

*Primary Examiner* — Son Dinh
(74) *Attorney, Agent, or Firm* — Arent Fox LLP

(57) ABSTRACT

A reception circuit includes a control signal generation circuit that generates a first enable signal based on a strobe signal and a second enable signal based on a core clock signal and a pointer control signal. A pattern data generation circuit generates determination pattern data from the first enable signal. An asynchronous transfer circuit latches the determination pattern data based on the first enable signal and the strobe signal and outputs determination data corresponding to the latched determination pattern data based on the second enable signal and the core clock signal. A determination circuit determines a timing for generating the pointer control signal based on the determination data. A set value calculation circuit calculates a transfer set value based on the determination result of the determination circuit. The control signal generation circuit updates the pointer control signal based on the transfer set value.

7 Claims, 19 Drawing Sheets

RECEPTION CIRCUIT, METHOD FOR ADJUSTING TIMING IN RECEPTION CIRCUIT, AND SEMICONDUCTOR DEVICE

CROSS-REFERENCE TO RELATED APPLICATIONS

This application is based upon and claims the benefit of priority from prior Japanese Patent Application No. 2015-108644, filed on May 28, 2015, the entire contents of which are incorporated herein by reference.

FIELD

This disclosure relates to a reception circuit, a method for adjusting a timing in the reception circuit, and a semiconductor device.

BACKGROUND

A semiconductor device, for example, a dynamic random access memory (DRAM), stores data that is used by a device of a system. A double data rate (DDR) memory, which is a semiconductor device, receives and outputs data on both the rising and falling edges of a clock signal or a strobe signal. The DDR memory increases the operation speed of the system.

The device of the system provides commands to the memory, and the memory is operated in accordance with the commands. For example, the device provides a read command and a read address to the memory. The memory reads data corresponding to the read address from cell arrays based on the read command. The memory generates a data strobe signal and outputs the read data in synchronization with the data strobe signal. The device in the system includes a reception circuit that receives the data strobe signal and the read data from the memory. The reception circuit adjusts the timing of the data strobe signal and retrieves the read data in accordance with the data strobe signal.

Relative timing (phase) differences between the read data and the data strobe signal may cause errors in the read data. Thus, the device includes a circuit that adjusts the timing of the data strobe signal relative to the read data. Japanese Laid-Open Patent Publication Nos. 2012-27734, 2012-58997, and 2013-58209 describe a circuit that adjusts the timing of the data strobe signal.

In the system, the device includes a core circuit (e.g., CPU), which controls the input and output of data between the device and the memory, and a control circuit (i.e., memory controller (MC)), which controls the memory. The core circuit and the control circuit receive and output data in accordance with an internal clock signal (e.g., system clock signal) that is used to operate the device in the system. After receiving the read data in accordance with the data strobe signal, the reception circuit outputs the read data in accordance with the internal clock signal.

Relative timing differences between the internal clock signal and the data strobe signal occur due to various factors including variations in operation voltage of the device and temperature change (referred to as VT drift). Such timing differences between the internal clock signal and the data strobe signal may cause an error in the read data that is output from the reception circuit in accordance with the internal clock signal.

SUMMARY

One aspect of the present disclosure is a reception circuit that includes a control signal generation circuit, a first asynchronous transfer circuit, a pattern data generation circuit, a second asynchronous transfer circuit, a determination circuit, and a set value calculation circuit. The control signal generation circuit generates: a first enable signal based on a strobe signal; a pointer control signal based on a read control signal, a transfer set value, and a core clock signal; and a second enable signal based on the pointer control signal and the core clock signal. The first asynchronous transfer circuit latches reception data based on the first enable signal and the strobe signal and outputs output data corresponding to the latched reception data based on the second enable signal and the core clock signal. The pattern data generation circuit generates determination pattern data from the first enable signal and inverts a logic of the determination pattern data in accordance with a change in the first enable signal. The second asynchronous transfer circuit latches the determination pattern data based on the first enable signal and the strobe signal and outputs determination data corresponding to the latched determination pattern data based on the second enable signal and the core clock signal. The determination circuit determines a timing for generating the pointer control signal based on the determination data output from the second asynchronous transfer circuit. The set value calculation circuit calculates the transfer set value based on a determination result of the determination circuit.

Other aspects and advantages of this disclosure will become apparent from the following description, taken in conjunction with the accompanying drawings, illustrating by way of example the principles of this disclosure.

BRIEF DESCRIPTION OF THE DRAWINGS

The embodiments are illustrated by way of example and are not limited by the accompanying figures, in which like references indicate similar elements. Elements in the figures are illustrated for simplicity and clarity and have not necessarily been drawn to scale. In the drawings, like numerals are used for like elements throughout.

DESCRIPTION OF THE EMBODIMENTS

First Embodiment

Figure 1:
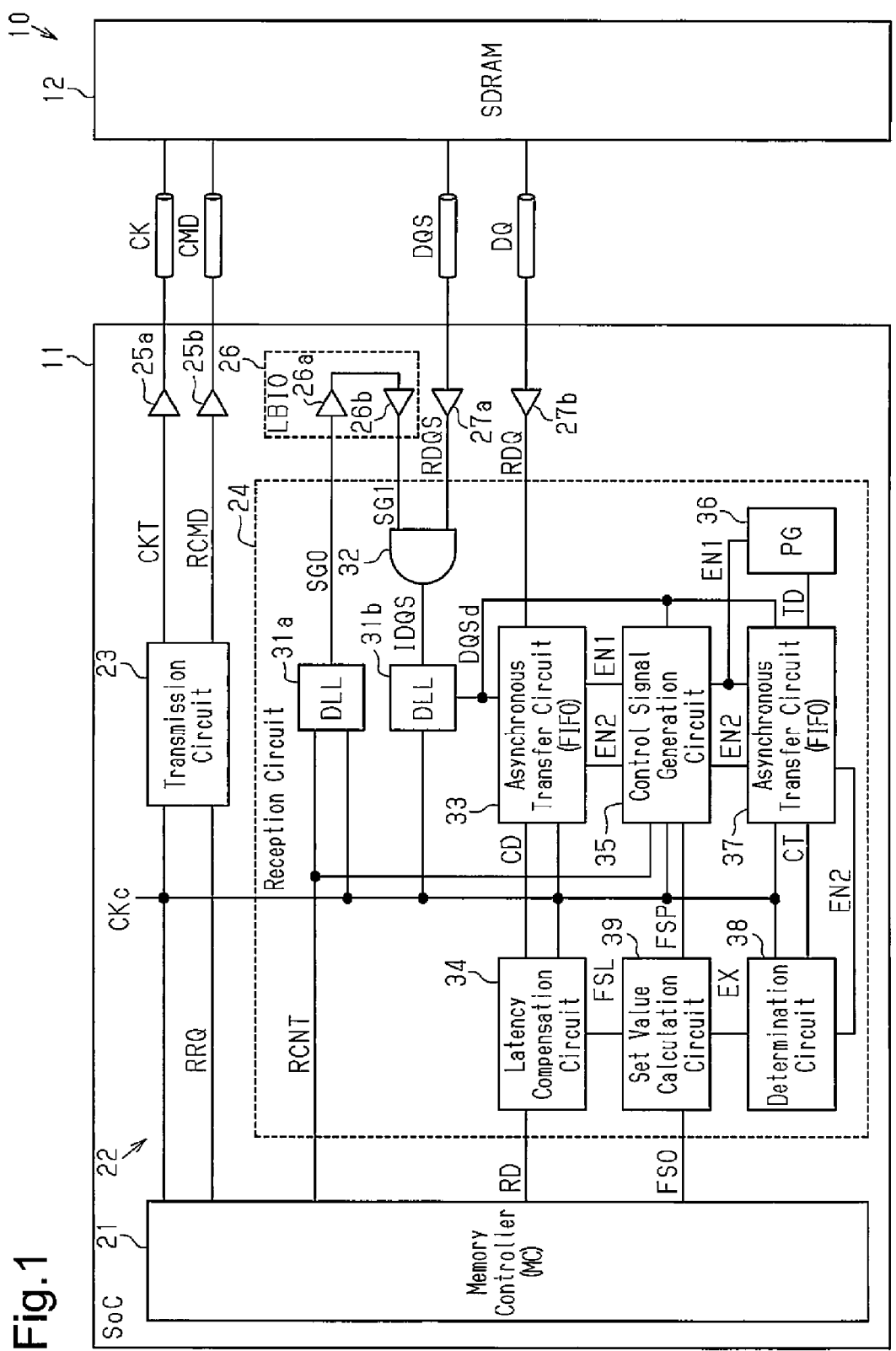
FIG. 1 is a schematic block circuit diagram illustrating a system that includes a first embodiment of a reception circuit.

A first embodiment will now be described. As illustrated in FIG. 1, a system 10 includes a device 11 including a semiconductor device and a memory 12 connected to the device 11. The device 11 is, for example, a semiconductor large-scale integration circuit (LSI), and includes a core circuit, which may be a central processing unit (CPU), and peripheral circuits. The device 11 is, for example, a system-on-chip (SoC) in which the core circuit and the peripheral circuits are mounted on one chip. The memory 12 is a synchronous semiconductor memory device and, for example, a double data rate 3 synchronous dynamic random access memory (DDR3-SDRAM).

The device 11 includes a memory controller 21 that is operated in accordance with a core clock signal CKc and an interface circuit 22 arranged between the memory controller 21 and the memory 12. The memory controller 21 accesses the memory 12 through the interface circuit 22 based on a request from the core circuit (not illustrated) of the device 11. The memory controller 21 generates, for example, a read instruction RRQ and a read control signal RCNT in response to a read request from the core circuit. The memory controller 21 sends a transfer initial value FS0 to the interface circuit 22.

The interface circuit 22 includes a transmission circuit 23 and a reception circuit 24. The transmission circuit 23 generates a clock signal CKT from the core clock signal CKc. The transmission circuit 23 also generates a read command RCMD based on the read instruction RRQ provided from the memory controller 21. The transmission circuit 23 is connected to output buffer circuits 25a, 25b. The output buffer circuit 25a generates a clock signal CK from the clock signal CKT. The clock signal CK is provided to the memory 12 through a first transmission line. The output buffer circuit 25b generates a command CMD from the read command RCMD. The command CMD is provided to the memory 12 through a second transmission line.

The memory 12 receives the command CMD in accordance with the clock signal CK. Although not illustrated in the drawings, the memory 12 receives a read address from the device 11 in accordance with the clock signal CK. The memory 12 performs a read operation based on the command CMD. In the read operation, the memory 12 retrieves data from the memory cell corresponding to the read address by an amount corresponding to a burst length (BL). In other words, the burst length corresponds to an amount of data that the memory 12 consecutively outputs in response to one read command RCMD. The burst length is set, for example, by the memory controller 21. In the first embodiment, the burst length is set to, for example, "8." The memory 12 outputs data DQ and a data strobe signal DQS. The data DQ and the data strobe signal DQS are provided to the device 11 through third and fourth transmission lines, respectively.

The device 11 is connected to input buffer circuits 27a, 27b. The input buffer circuit 27a generates a reception strobe signal RDQS from the data strobe signal DQS. The input buffer circuit 27b generates reception data RDQ from the data DQ.

In a process for retrieving and outputting (transferring) the reception data RDQ (data DQ), the reception circuit 24 performs a clock replacement from the reception strobe signal RDQS to the core clock signal CKc. The reception circuit 24 sets the timing for the clock replacement from the reception strobe signal RDQS to the core clock signal CKc based on a transfer set value FSP (initially, transfer initial value FS0). Additionally, the reception circuit 24 adjusts the set value of the clock replacement timing in accordance with retardation or advancement of the reception strobe signal RDQS relative to the present replacement timing.

A period from when the interface circuit 22 receives the read instruction RRQ from the memory controller 21 to when the interface circuit 22 outputs (transfers) read data RD to the memory controller 21 is set as a read latency (RL). The read latency is expressed, for example, by the number of cycles of the core clock signal CKc. A period from when the interface circuit 22 outputs a read command RCMD (command CMD) to when the interface circuit 22 receives the data DQ corresponding to the read command RCMD is referred to as a round trip time (RTT).

The round trip time changes in accordance with changes in the environment temperature of the system 10 and variations in the power supply voltage at which the system 10 operates (hereafter, referred to as VT drift). The VT drift causes relative timing differences between the clock replacement timing (set value) and the reception strobe signal RDQS. Such timing differences hinder high-speed data transfer using a high frequency clock signal and a strobe signal. The reception circuit 24 retrieves the reception data RDQ in accordance with the core clock signal CKc in a valid window range that allows for the retrieval of the reception data RDQ. The reception circuit 24 adjusts the timing for retrieving the reception data RDQ based on the data strobe signal DQS (reception data strobe signal RDQS).

The memory controller 21, which is operated in accordance with the core clock signal CKc, outputs a read request and, subsequent to the cycles corresponding to the set read latency, receives the read data RD. In this case, if the timing for retrieving the reception data RDQ is adjusted in accordance with the core clock signal CKc, the latency of the read data RD received by the memory controller 21 may be deviated from the set read latency. Thus, the reception circuit 24 compensates for the timing for outputting the read data RD in accordance with the read latency of the memory controller 21. That is, the reception circuit 24 compensates for the latency of the read data RD transferred to the memory controller 21.

The reception circuit 24 includes delay locked loop (DLL) circuits 31a, 31b. The DLL circuit 31a receives the read control signal RCNT and the core clock signal CKc. The DLL circuit 31a is set to a first delay value, for example, by the memory controller 21. The DLL circuit 31a generates a gate signal SG0 by delaying the read control signal RCNT in accordance with the first delay value and outputs the gate signal SG0 in accordance with the core clock signal CKc. The memory controller 21 takes account of the latency in the memory 12 and outputs an H-level read control signal RCNT for a period corresponding to the timing when the reception circuit 24 retrieves the data DQ from the memory 12.

The first delay value of the DLL circuit 31a is set in accordance with the connected memory 12. The memory controller 21 executes, for example, a training process at a given timing and sets the DLL circuit 31a to a first delay value corresponding to the training process result. The training process calibrates (adjusts) the timing when the reception circuit 24 retrieves the data DQ. The memory controller 21 executes the training process at a given timing, for example, when activating the device 11 or any timing when the memory 12 is not accessed during the operation of the device 11. The training process prevents the retrieval of erroneous data during a period in which data does not need to be retrieved.

A loop back input output circuit 26 (LBIO) includes buffer circuits 26a, 26b. The buffer circuit 26a has the same electric properties as the output buffer circuits 25a, 25b and outputs an output signal in response to an input signal. The delay time (delay time property) of the output signal relative to the input signal in the buffer circuit 26a is the same as the delay time property of the output buffer circuits 25a, 25b. The buffer circuit 26b has the same electric properties (delay time property) as the input buffer circuits 27a, 27b. The loop back input output circuit 26 delays the gate signal SG0 and generates a delay gate signal SG1.

The gate circuit 32 outputs the reception strobe signal RDQS when the delay gate signal SG1 is active. The gate circuit 32 is, for example, a logical AND operation circuit, and outputs an internal strobe signal IDQS, which is obtained from a result of the AND operation performed on the delay gate signal SG1 and the reception strobe signal RDQS.

The delay locked loop (DLL) circuit 31b is set to a second delay value. The DLL circuit 31b generates a delay strobe signal DQSd by delaying the internal strobe signal IDQS in accordance with the second delay value and outputs the delay strobe signal DQSd in accordance with the core clock signal CKc. The second delay value of the DLL circuit 31b is set in accordance with a cycle of the delay strobe signal DQSd, or a cycle of the data strobe signal DQS (internal strobe signal IDQS). The second delay value of the DLL circuit 31b is set, for example, through the training process using a quarter of a cycle (90 degrees in phase) of the internal strobe signal IDQS as a reference value.

An asynchronous transfer circuit 33 receives the reception data RDQ. The asynchronous transfer circuit 33 is provided with the delay strobe signal DQSd and the core clock signal CKc. The asynchronous transfer circuit 33 is also provided with enable signals EN1, EN2 from a control signal generation circuit 35.

The asynchronous transfer circuit 33 is an asynchronous first-in first-out (FIFO) circuit. The asynchronous transfer circuit 33 enables the input function based on the enable signal EN1 and latches the reception data RDQ in accordance with the delay strobe signal DQSd. The asynchronous transfer circuit 33 latches the reception data RDQ having the data amount corresponding to the burst length on both a rising edge and a falling edge of the delay strobe signal DQSd. The asynchronous transfer circuit 33 enables the output function based on the enable signal EN2 and outputs output data CD corresponding to the latched reception data RDQ in accordance with the core clock signal CKc.

The latency compensation circuit 34 delays the output data CD of the asynchronous transfer circuit 33 in accordance with a delay amount set in the latency compensation circuit 34 and outputs the read data RD. The latency compensation circuit 34 sets a delay amount of the read data RD relative to the output data CD based on a latency set value FSL.

The control signal generation circuit 35 is provided with the transfer set value FSP from a set value calculation circuit 39. The control signal generation circuit 35 is also provided with the core clock signal CKc, the delay strobe signal DQSd, and the read control signal RCNT. The memory controller 21 illustrated in FIG. 1 determines a transfer initial value FSO through the training process and provides the transfer initial value FSO to the set value calculation circuit 39. The set value calculation circuit 39 calculates the transfer set value FSP from the transfer initial value FSO.

The control signal generation circuit 35 generates a first enable signal EN1 from the delay strobe signal DQSd. The control signal generation circuit 35 also generates a second enable signal EN2 based on the transfer set value FSP, the read control signal RCNT, and the core clock signal CKc. The control signal generation circuit 35 generates a delay signal by delaying the read control signal RCNT based on the transfer set value FSP and the core clock signal CKc. The control signal generation circuit 35 generates the second enable signal EN2 based on the delay signal and the core clock signal CKc.

A pattern data generation circuit 36 (PG) outputs determination pattern data TD in accordance with the enable signal EN1. The pattern data generation circuit 36 inverts the logic value of the determination pattern data TD in accordance with changes in the enable signal EN1. The pattern data generation circuit 36 inverts the logic value of the determination pattern data TD, for example, whenever the enable signal EN1 is input (e.g., at each rising edge of enable signal EN1). Thus, the logic value of the determination pattern data TD is alternately changed to "0," "1," "0," . . . in accordance with the enable signal EN1.

The control signal generation circuit 35 counts the delay strobe signals DQSd and generates the enable signal EN1. The memory 12 outputs the data DQ having the burst length at the timings of a rising edge and a falling edge of the data strobe signal DQS. The DLL circuit 31b of the reception circuit 24 delays the internal strobe signal IDQS (i.e., reception strobe signal RDQS) and generates the delay strobe signal DQSd. Thus, the pattern data generation circuit 36 generates the determination pattern data TD by inverting the logic value of the enable signal EN1 whenever the delay strobe signal DQSd having pulses corresponding to the burst length is input.

In the same manner as the asynchronous transfer circuit 33, an asynchronous transfer circuit 37 is provided with the delay strobe signal DQSd, the core clock signal CKc, and the enable signals EN1, EN2.

The asynchronous transfer circuit 37 is an asynchronous first-in first-out (FIFO) circuit. The asynchronous transfer circuit 37 enables the input function based on the enable signal EN1 and latches the determination pattern data TD in accordance with the delay strobe signal DQSd. The asynchronous transfer circuit 37 enables the output function based on the enable signal EN2 and outputs determination data CT corresponding to the latched determination pattern data TD in accordance with the core clock signal CKc.

The determination data CT, the core clock signal CKc, and the enable signal EN2 are provided to a determination circuit 38. The determination circuit 38 generates expected value data based on the enable signal EN2. Additionally, the determination circuit 38 inverts the logic value of the expected value data whenever receiving the enable signal EN2. In the present example, in the same manner as the determination pattern data TD generated by the pattern data generation circuit 36, the determination circuit 38 alternately changes the logic value of the expected value data to "0," "1," "0," . . . whenever receiving the enable data EN2. The determination circuit 38 compares the determination data CT with the expected value data and generates a determination signal EX in accordance with the comparison result.

The set value calculation circuit 39 is provided with the transfer initial value FSO from the memory controller 21. The set value calculation circuit 39 calculates a transfer set value FSP based on the determination signal EX provided from the determination circuit 38 and provides the transfer set value FSP to the control signal generation circuit 35. The set value calculation circuit 39 also calculates a latency set value FSL based on the determination signal EX provided from the determination circuit 38 and provides the latency set value FSL to the latency compensation circuit 34.

Figure 2:
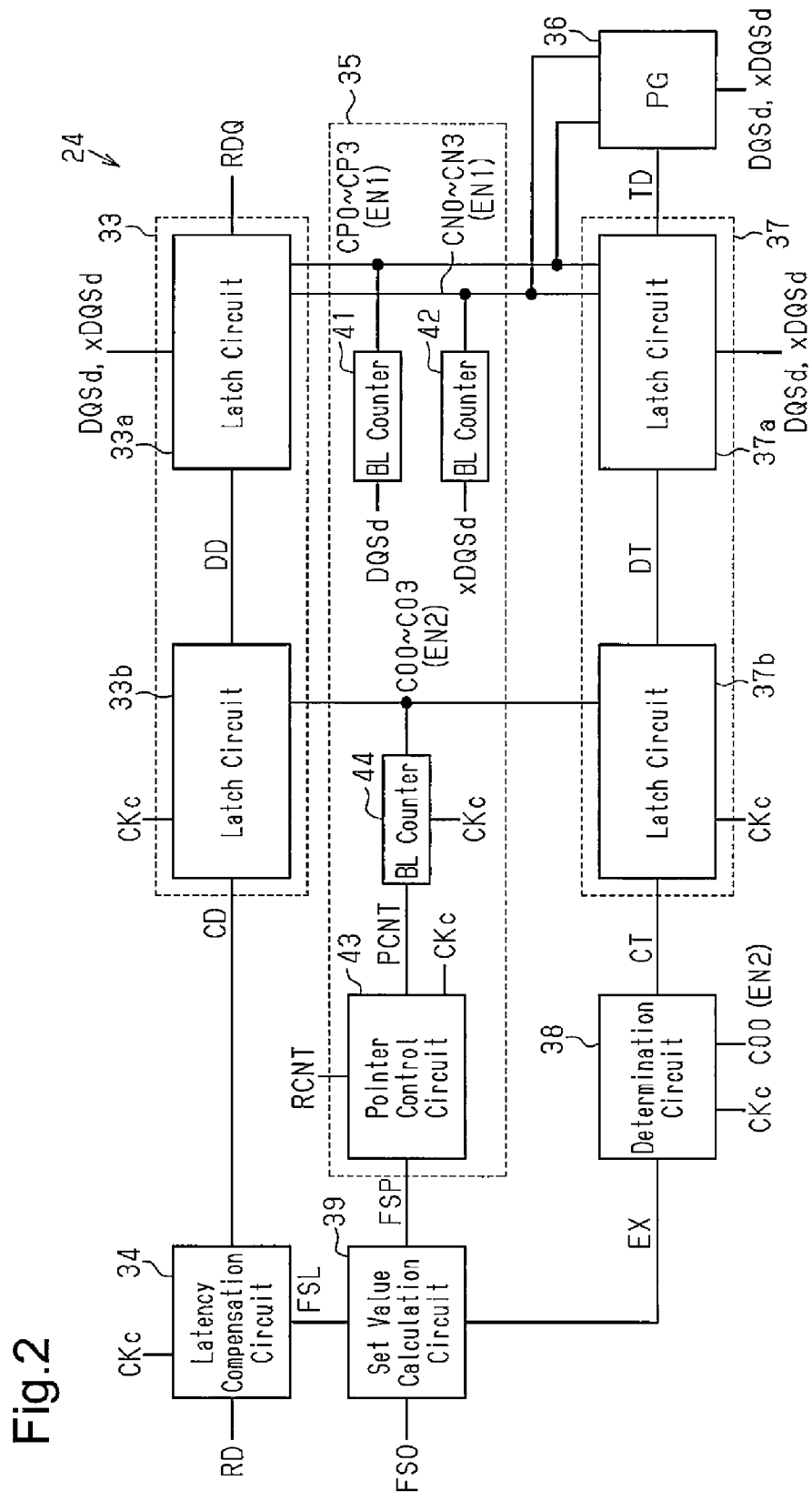
FIG. 2 is a schematic block circuit diagram illustrating a portion of the reception circuit illustrated in FIG. 1.

As illustrated in FIG. 2, the control signal generation circuit 35 includes burst length (BL) counters 41, 42, 44 and a pointer control circuit 43.

The BL counters 41, 42 are each, for example, a quaternary one-hot state counter. The BL counters 41, 42 are used to generate a first enable signal EN1. The BL counter 41 counts rising edges (positive edges) of the delay strobe signal DQSd and generates enable signals CP0 to CP3. The BL counter 42 counts falling edges (negative edges) of the delay strobe signal DQSd and generates enable signals CN0 to CN3. In the present example, when counting the falling edges of the delay strobe signal DQSd, the BL counter 42 uses an inverse strobe signal xDQSd, which has the inverse logic of the delay strobe signal DQSd. The enable signals CP0 to CP3 are each one example of a positive phase enable signal. The enable signals CN0 to CN3 are each one example of a negative phase enable signal.

As illustrated in FIG. 3A, the BL counter 41 includes four flip-flop (FF) circuits 51a to 51d. The FF circuits 51a to 51d are, for example, a D-type flip-flop circuit. The delay strobe signal DQSd is provided to the clock terminals of the FF circuits 51a to 51d. The output terminals (Q) of the FF circuit 51a to 51c are connected to the input terminals (data terminals D) of the FF circuits 51b to 51d, respectively. The output terminal (Q) of the FF circuit 51d is connected to the input terminal (data terminal D) of the FF circuit 51a. The FF circuit 51a outputs an H-level enable signal CP0 when reset by, for example, an L-level signal provided to the preset terminal (not illustrated). The FF circuits 51b to 51d output L-level enable signals CP1 to CP3 when reset by, for example, an L-level signal provided to the present terminal (not illustrated). The FF circuits 51a to 51d output the enable signals CP0 to CP3 that have the same level as the data terminals in accordance with an H-level delay strobe signal DQSd. The enable signals CP0 to CP3 are included in the enable signal EN1 illustrated in FIG. 1.

As illustrated in FIG. 3B, the BL counter 42 includes four flip-flop (FF) circuits 52a to 52d. The FF circuits 52a to 52d are, for example, a D-type flip-flop circuit. The inverse strobe signal xDQSd is provided to the clock terminals of the FF circuits 52a to 52d. The inverse strobe signal xDQSd is generated, for example, when an inverter circuit (not illustrated) logically inverts the delay strobe signal DQSd output from the DLL circuit 31b illustrated in FIG. 1. The inverter circuit may be included in the control signal generation circuit 35 (e.g., preceding stage of BL counter 42) or may be included in the DLL circuit 31b. The timing of the falling edge of the delay strobe signal DQSd is the same as the timing of the rising edge of the inverse strobe signal xDQSd. Thus, the BL counter 42, which is the same circuit as the BL counter 41, is provided with the inverse strobe signal xDQSd and generates the enable signals CN0 to CN3, which correspond to the falling edge (negative edge) of the delay strobe signal DQSd.

The output terminals (Q) of the FF circuit 52a to 52c are connected to the input terminals (data terminals D) of the FF circuits 52b to 52d, respectively. The output terminal (Q) of the FF circuit 52d is connected to the input terminal (data terminal D) of the FF circuit 52a. The FF circuit 52a outputs an H-level enable signal CN0 when reset by, for example, an L-level signal provided to the preset terminal (not illustrated). The FF circuits 52b to 52d output L-level enable signals CN1 to CN3 when reset by, for example, an L-level signal provided to the present terminal (not illustrated). The FF circuits 52a to 52d output the enable signals CN0 to CN3 that have the same level as the data terminals in accordance with an H-level inverse strobe signal xDQSd. The enable signals CN0 to CN3 are included in the enable signal EN1 illustrated in FIG. 1.

Figure 4:
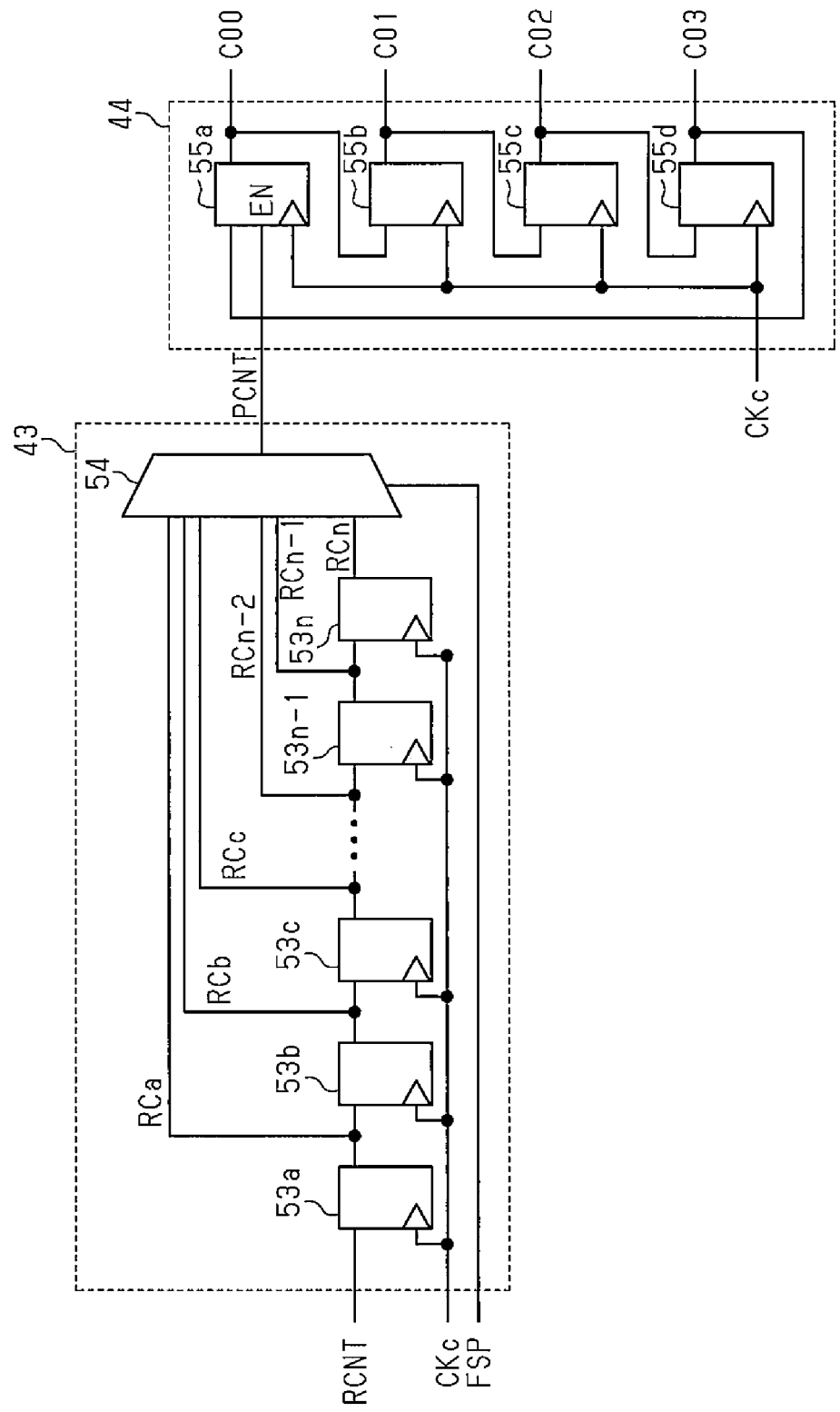
FIG. 4 is a schematic circuit diagram illustrating a pointer control circuit and a third BL counter of the control signal generation circuit.

As illustrated in FIG. 4, the pointer control circuit 43 includes flip-flop (FF) circuits 53a, 53b, 53c, . . . , 53n−1, 53n and a multiplexer 54 (MUX). The FF circuits 53 to 53n are, for example, a D-type flip-flop circuit. The FF circuits 53a to 53n are connected in series. Namely, the output terminal (Q) of the FF circuit 53a in the first stage is connected to the input terminal (data terminal D) of the FF circuit 53b in the second stage. The output terminal (Q) of the FF circuit 53b is connected to the input terminal (data terminal D) of the FF circuit 53c in the third stage. The output terminal (Q) of the FF circuit 53n−1 in the (n−1)th stage is connected to the input terminal (data terminal D) of the FF circuit 53n in the (n)th stage.

The core clock signal CKc is provided to the clock terminals of the FF circuits 53a to 53n. The read control signal RCNT is provided to the input terminal (data terminal D) of the first FF circuit 53a. The FF circuits 53a to 53n respectively output signals RCa to RCn that have the same level as the data terminal in accordance with an H-level core clock signal CKc. The signals RCa to RCn are provided to the multiplexer 54.

The multiplexer 54 is provided with the transfer set value FSP. The multiplexer 54 selects one of the signals RCa to RCn in accordance with the transfer set value FSP and outputs a pointer control signal PCNT that has the same level as the selected signal.

The read control signal RCNT is provided to the FF circuit 53a. The output signals RCa to RCn−1 of the FF circuits 53a to 53n−1 are provided to the data terminals of the FF circuits 53b to 53n, respectively. Thus, the FF circuits 53a to 53n sequentially forward the read control signal RCNT in accordance with the core clock signal CKc. In other words, the FF circuits 53a to 53n delay the read control signal RCNT and output the signals RCa to RCn, respectively. The delay time of each of the FF circuits 53a to 53n corresponds to one cycle of the core clock signal CKc. The multiplexer 54 selects one of the signals RCa to RCn in accordance with the transfer set value FSP. Thus, the pointer control circuit 43 generates the pointer control signal PCNT by delaying the read control signal RCNT by the number of cycles of the core clock signal CKc corresponding to the transfer set value FSP. The pointer control signal PCNT is provided to the BL counter 44.

The BL counter 44 is, for example, a quaternary one-hot state counter. The BL counter 44 is used to generate a second enable signal EN2. The BL counter 44 counts the core clock signals CKc and generates enable signals C00 to C03.

The BL counter 44 includes four flip-flop (FF) circuits 55a to 55d. The FF circuits 55a to 55d are, for example, a D-type flip-flop circuit.

The FF circuit 55a includes an enable terminal (EN), and the pointer control signal PCNT is provided to the enable terminal (EN). The core clock signal CKc is provided to the clock terminals of the FF circuits 55a to 55d. The output terminals (Q) of the FF circuits 55a to 55c are connected to the input terminals (data terminals) of the FF circuits 55b to 55d, respectively. The output terminal (Q) of the FF circuit 55d is connected to the input terminal (data terminal) of the FF circuit 55a.

The FF circuit 55a outputs an H-level enable signal C00 when reset, for example, by an L-level signal provided to a preset terminal (not illustrated). The FF circuits 55b to 55d output L-level enable signals C01 to C03 when reset, for example, by an L-level signal provided to the preset terminal (not illustrated). When the pointer control signal PCNT is the H level, the FF circuit 55a outputs the enable signal C00 that has the same level as the data terminal in accordance with the core clock signal CKc. The FF circuits 55b to 55d output the enable signals C01 to C03 in accordance with the enable signals C00 to C02, respectively. The FF circuit 55a outputs the enable signal C00 based on the enable signal C03. The enable signals C00 to C03 are included in the enable signal EN2 illustrated in FIG. 1.

As illustrated in FIG. 2, the asynchronous transfer circuit 33 includes a first latch circuit 33a and a second latch circuit 33b. The first latch circuit 33a is one example of a first latch circuit. The second latch circuit 33b is one example of a second latch circuit.

The first latch circuit 33a is provided with the delay strobe signal DQSd, the inverse strobe signal xDQSd, and the enable signals CP0 to CP3, CN0 to CN3. The second latch circuit 33b is provided with the core clock signal CKc and the enable signals C00 to C03.

Figure 5:
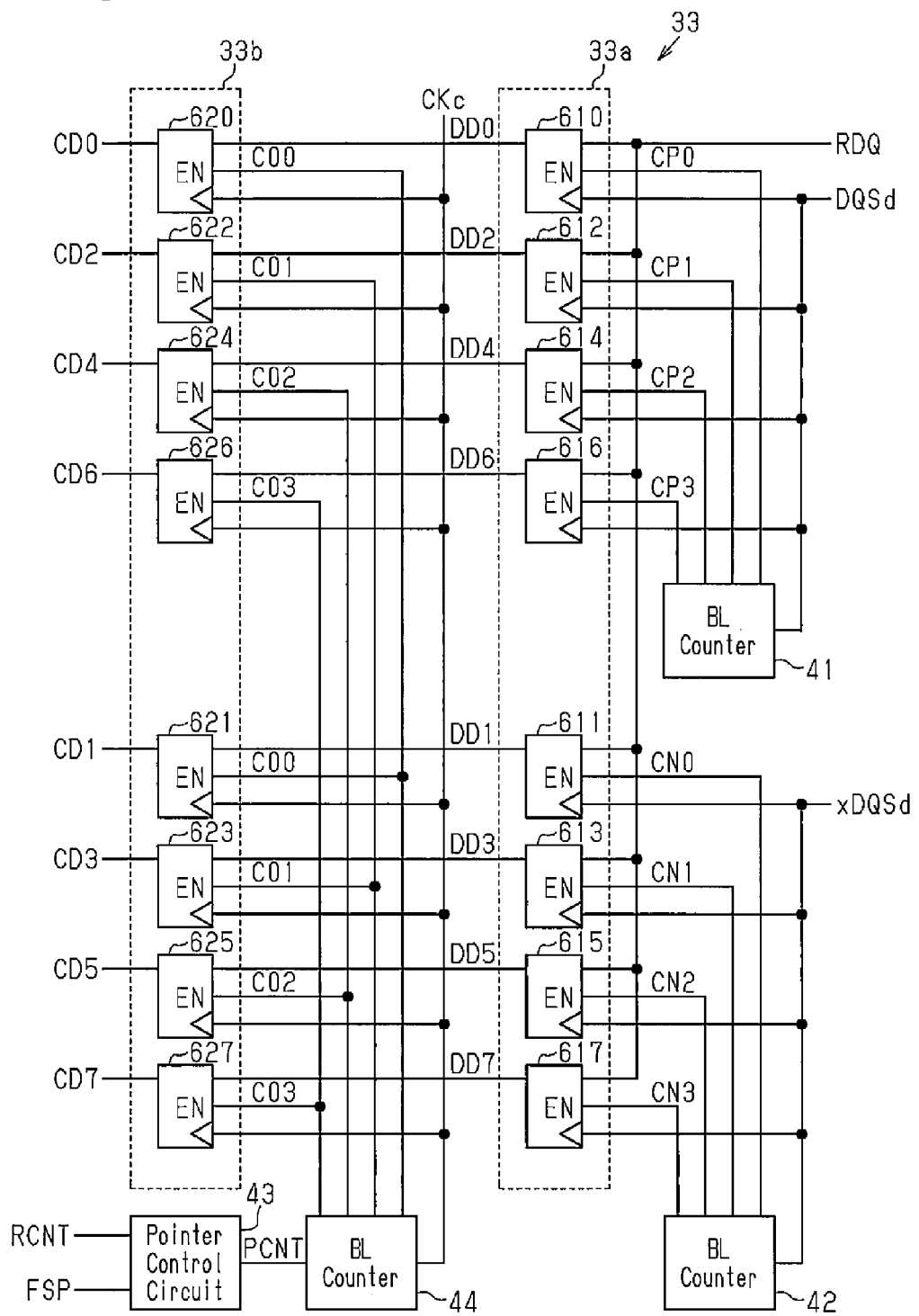
FIG. 5 is a schematic circuit diagram illustrating an asynchronous transfer circuit.

As illustrated in FIG. 5, the first latch circuit 33a includes eight flip-flop (FF) circuits 610 to 617. The FF circuits 610 to 617 are, for example, a D-type flip-flop circuit. The reception data RDQ is provided to the input terminals (data terminals D) of the FF circuits 610 to 617.

The enable signals CP0 to CP3 are provided to the enable terminals (EN) of the FF circuits 610, 612, 614, 616, respectively. The delay strobe signal DQSd is provided to the clock terminals of the FF circuits 610, 612, 614, 616. When the enable signals CP0 to CP3 are the H level, the FF circuits 610, 612, 614, 616 latch the reception data RDQ in accordance with the H-level delay strobe signal DQSd and output signals DD0, DD2, DD4, DD6 that have the same level as the latched reception data RDQ. That is, the FF circuits 610, 612, 614, 616 latch the reception data RDQ at the timing of the rising edge of the delay strobe signal DQSd and respectively output the signals DD0, DD2, DD4, DD6 that have the level corresponding to the latched reception data RDQ.

The enable signals CN0 to CN3 are provided to the enable terminals (EN) of the FF circuits 611, 613, 615, 617, respectively. The inverse strobe signal xDQSd is provided to the clock terminals of the FF circuits 611, 613, 615, 617. When the enable signals CN0 to CN3 are the H level, the FF circuits 611, 613, 615, 617 latch the reception data RDQ in accordance with the H-level inverse strobe signal xDQSd and respectively output signals DD1, DD3, DD5, DD7 that have the same level as the latched reception data RDQ. That is, the FF circuits 611, 613, 615, 617 latch the reception data RDQ at the timing of the falling edge of the delay strobe signal DQSd and respectively output the signal DD1, DD3, DD5, DD7 that have the level corresponding to the latched reception data RDQ.

The second latch circuit 33b includes eight flip-flop (FF) circuits 620 to 627. The FF circuits 620 to 627 are, for example, a D-type flip-flop circuit.

The core clock signal CKc is provided to the clock terminals of the FF circuits 620 to 627. The signals DD0 to DD7 are provided to the input terminals (data terminals D) of the FF circuits 620 to 627. The enable signal C00 is provided to the enable terminals (EN) of the FF circuits 620, 621. The enable signal C01 is provided to the enable terminals (EN) of the FF circuits 622, 623. The enable signal C02 is provided to the enable terminals (EN) of the FF circuits 624, 625. The enable signal C03 is provided to the enable terminals (EN) of the FF circuits 626, 627.

When the enable signal C00 is the H level, the FF circuits 620, 621 latch the signals DD0, DD1 in accordance with the H-level core clock signal CKc and respectively output output data CD0, CD1 that have the same level as the latched signals DD0, DD1. In the same manner, when the enable signals C01 to C03 are the H level, the FF circuits 622 to 627 latch the signals DD2 to DD7 in accordance with the H-level core clock signal CKc and respectively output output data CD2 to CD7 that have the same level as the latched signals DD2 to DD7.

Thus, the first latch circuit 33a latches the reception data RDQ and generates the signals DD0 to DD7 at the timing that is dependent on the delay strobe signal DQSd. The first latch circuit 33a belongs to the DQS domain. The second latch circuit 33d latches the signals DD0 to DD7 and generates the output data CD0 to CD7 at the timing that is dependent on the core clock signal CKc. The second latch circuit 33b belongs to the core clock domain.

Figure 6:
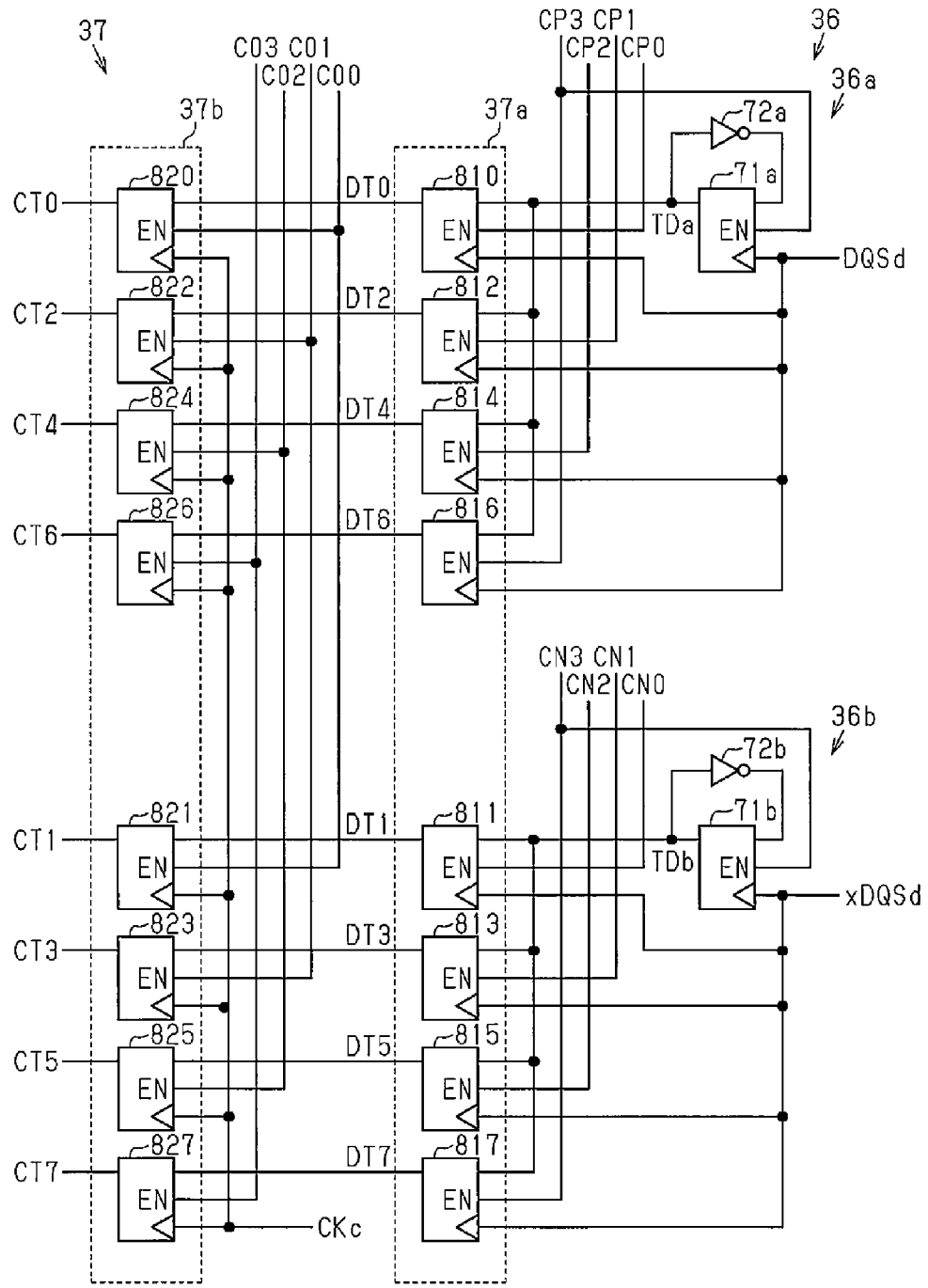
FIG. 6 is a schematic circuit diagram illustrating a pattern data generation circuit and an asynchronous transfer circuit.

As illustrated in FIG. 6, the pattern data generation circuit 36 includes a first data generation circuit 36a and a second data generation circuit 36b.

The first data generation circuit 36a generates determination pattern data TDa based on the delay strobe signal DQSd and the enable signal CP3. The determination pattern data TDa is one example of first determination pattern data.

The first data generation circuit 36a includes a FF circuit 71a and an inverter circuit 72a. The FF circuit 71a is, for example, a D-flip-flop circuit including an enable terminal (EN). The delay strobe signal DQSd is provided to the clock terminal of the FF circuit 71a. The enable signal CP3 is provided to the enable terminal (EN) of the FF circuit 71a. The output terminal of the FF circuit 71a is connected to the input terminal of the inverter circuit 72a. The output terminal of the inverter circuit 72a is connected to the data input terminal of the FF circuit 71a.

In a period of time when the enable signal CP3 is the H level, the FF circuit 71a outputs the determination pattern data TDa that has the same level as the data input terminal based on the rising edge of the delay strobe signal DQSd. The inverter circuit 72a provides a logically inverse signal of the determination pattern data TDa to the data input terminal of the FF circuit 71a. Thus, in the period of time when the enable signal CP3 is the H level, the first data generation circuit 36a inverts the logical level of the determination pattern data TDa at the timing of the rising edge of the delay strobe signal DQSd.

The second data generation circuit 36b generates determination pattern data TDb based on the inverse strobe signal xDQSd and the enable signal CN3. The determination pattern data TDb is one example of second determination pattern data.

The second data generation circuit 36b includes a FF circuit 71b and an inverter circuit 72b. The FF circuit 71b is, for example, a D-flip-flop circuit including an enable terminal (EN). The inverse strobe signal xDQSd is provided to the clock terminal of the FF circuit 71b. The enable signal CN3 is provided to the enable terminal (EN) of the FF circuit 71b. The output terminal of the FF circuit 71b is connected to the input terminal of the inverter circuit 72b. The output terminal of the inverter circuit 72b is connected to the data input terminal of the FF circuit 71b.

In a period of time when the enable signal CN3 is the H level, the FF circuit 71b outputs the determination pattern data TDb that has the same level as the data input terminal based on the rising edge of the inverse strobe signal xDQSd, or the falling edge of the delay strobe signal DQSd. The inverter circuit 72b provides a logically inverse signal of the determination pattern data TDb to the data input terminal of the FF circuit 71b. Thus, in the period of time when the enable signal CN3 is the H level, the second data generation circuit 36b inverts the logical level of the determination pattern data TDb at the timing of the rising edge of the inverse strobe signal xDQSd (falling edge of delay strobe signal DQSd).

As illustrated in FIG. 2, the asynchronous transfer circuit 37 includes a first latch circuit 37a and a second latch circuit 37b. The first latch circuit 37a is one example of a third latch circuit. The second latch circuit 37b is one example of a fourth latch circuit.

The first latch circuit 37a is provided with the delay strobe signal DQSd, the inverse strobe signal xDQSd, and the enable signals CP0 to CP3, CN0 to CN3. The second latch circuit 37b is provided with the core clock signal CKc and the enable signals C00 to C03.

As illustrated in FIG. 6, in the same manner as the first latch circuit 33a illustrated in FIG. 5, the first latch circuit 37a includes FF circuits 810 to 817. The FF circuits 810 to 817 are, for example, a D-type flip-flop circuit. The delay strobe signal DQSd is provided to the clock terminals of the FF circuits 810, 812, 814, 816. The determination pattern data TDa is provided to the input terminals (data terminals D) of the FF circuits 810, 812, 814, 816. The enable signals CP0, CP1, CP2, CP3 are provided to the enable terminals (EN) of the FF circuits 810, 812, 814, 816, respectively.

When the enable signal CP0 is the H level, the FF circuit 810 latches the determination pattern data TDa at the timing of the rising edge of the delay strobe signal DQSd and outputs a transfer signal DT0 that has the same level as the latched determination pattern data TDa. In the same manner, when the enable signals CP1, CP2, CP3 are the H level, the FF circuits 812, 814, 816 latch the determination pattern data TDa at the timing of the rising edge of the delay strobe signal DQSd and respectively output transfer signals DT2, DT4, DT6 that have the same level as the latched determination pattern data TDa. Thus, the FF circuits 810, 812, 814, 816 respectively output the transfer signals DT0, DT2, DT4, DT6 that have the level corresponding to the determination pattern data TDa at the timing of the rising edge of the delay strobe signal DQSd.

The inverse strobe signal xDQSd is provided to the clock terminals of the FF circuits 811, 813, 815, 817. The determination pattern data TDb is provided to the input terminals (data terminals D) of the FF circuits 811, 813, 815, 817. The enable signals CN0, CN1, CN2, CN3 are provided to the enable terminals (EN) of the FF circuits 811, 813, 815, 817, respectively.

When the enable signal CN0 is the H level, the FF circuit 811 latches the determination pattern data TDb at the timing of the rising edge of the inverse strobe signal xDQSd and outputs a transfer signal DT1 that has the same level as the latched determination pattern data TDb. In the same manner, when the enable signals CN1 to CN3 are the H level, the FF circuits 813, 815, 817 latch the determination pattern data TDb at the timing of the rising edge of the inverse strobe signal xDQSd and respectively output transfer signals DT3, DT5, DT7 that have the same level as the latched determination pattern data TDb. Thus, the FF circuits 811, 813, 815, 817 respectively output the transfer signals DT1, DT3, DT5, DT7 that have the same level as the determination pattern data TDb at the timing of the falling edge of the delay strobe signal DQSd.

Thus, the first latch circuit 37a enables the latch function based on the enable signals CP0 to CP3, CN0 to CN3. The first latch circuit 37a latches the determination pattern data TDa, TDb on both the rising edge and the falling edge of the delay strobe signal DQSd and generates the transfer signals DT0 to DT7.

In the same manner as the second latch circuit 33b illustrated in FIG. 5, the second latch circuit 37b includes FF circuits 820 to 827. The FF circuits 820 to 827 are, for example, a D-type flip-flop circuit. The core clock signal CKc is provided to the clock terminals of the FF circuits 820 to 827. The transfer signals DT0 to DT7 are respectively provided to the input terminals (data terminals D) of the FF circuits 820 to 827. The enable signal C00 is provided to the enable terminals (EN) of the FF circuits 820, 821. The enable signal C01 is provided to the enable terminals (EN) of the FF circuits 822, 823. The enable signal C02 is provided to the enable terminals (EN) of the FF circuits 824, 825. The enable signal C03 is provided to the enable terminals (EN) of the FF circuits 826, 827.

When the enable signal C00 is the H level, the FF circuits 820, 821 latch the transfer signals DT0, DT1 at the timing of the rising edge of the core clock signal CKc and respectively output determination data CT0, CT1 that have the same level as the latched transfer signals DT0, DT1. In the same manner, when the enable signal C01 is the H level, the FF circuits 822, 823 latch the transfer signals DT2, DT3 at the timing of the rising edge of the core clock signal CKc and respectively output determination data CT2, CT3 that have the same level as the latched transfer signals DT2, DT3. When the enable signal C02 is the H level, the FF circuits 824, 825 latch the transfer signals DT4, DT5 at the timing of the rising edge of the core clock signal CKc and respectively output determination data CT4, CT5 that have the same level as the latched transfer signals DT4, DT5. When the enable signal C03 is the H level, the FF circuits 826, 827 latch the transfer signals DT6, DT7 at the timing of the rising edge of the core clock signal CKc and respectively output determination data CT6, CT7 that have the same level as the latched transfer signals DT6, DT7.

Thus, the FF circuits 820 to 827 respectively output the determination data CT0 to CT7 that have the level corresponding to the transfer signals DT0 to DT7 at the timing of the rising edge of the core clock signal CKc. The second latch circuit 37b enables the latch function based on the enable signals C00 to C03. The second latch circuit 37b latches the transfer signals DT0 to DT7 at the rising edge of the core clock signal CKc and generates the determination data CT0 to CT7.

Figure 7:
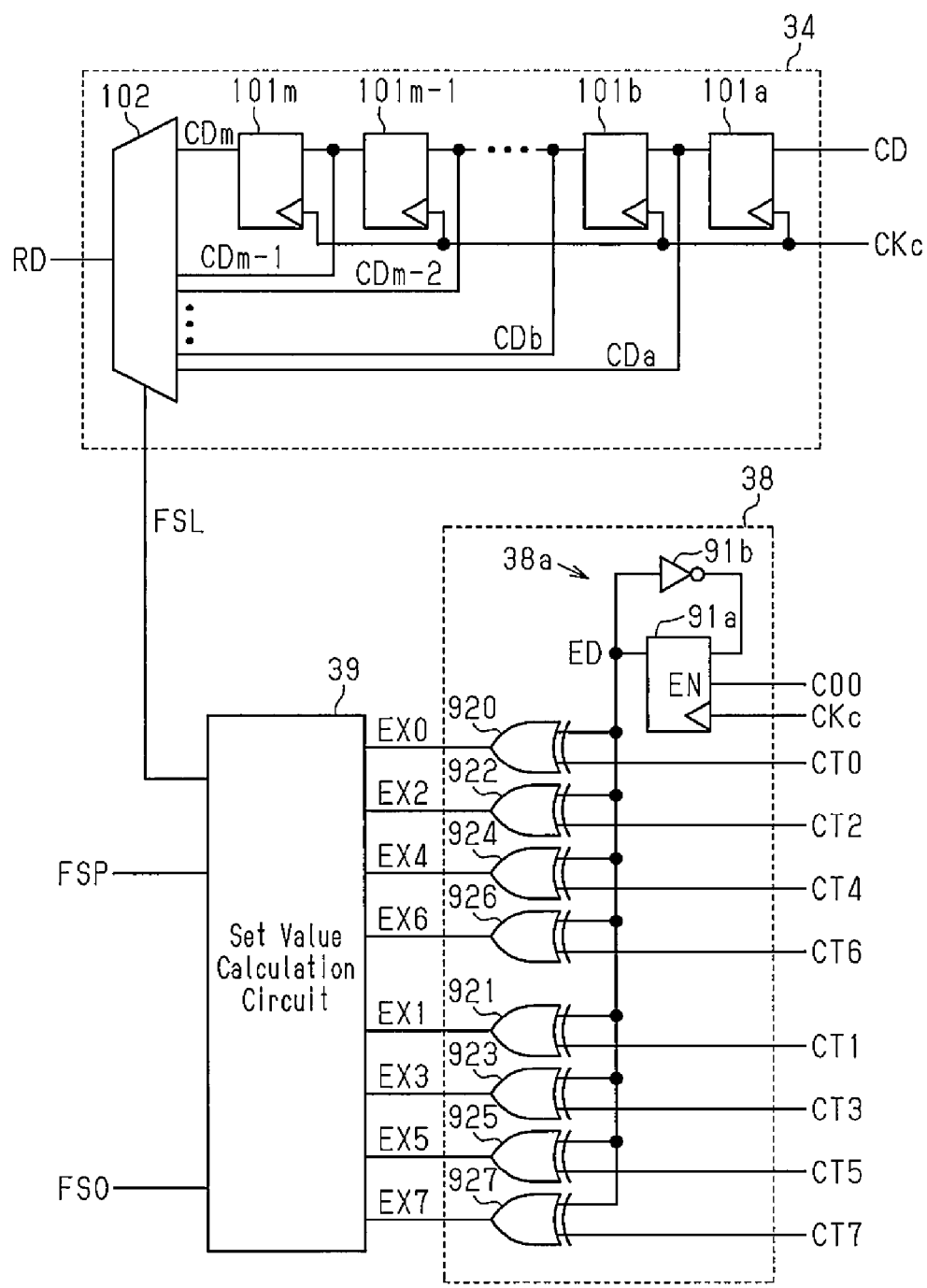
FIG. 7 is a schematic circuit diagram illustrating a determination circuit, a set value calculation circuit, and a latency compensation circuit.

As illustrated in FIG. 7, the determination circuit 38 includes an expected value data generation circuit 38a. The expected value data generation circuit 38a includes a FF circuit 91a and an inverter circuit 91b.

The core clock signal CKc is provided to the input terminal of the FF circuit 91*a*. The enable signal C00 is provided to the enable terminal (EN) of the FF circuit 91*a*. The output terminal (Q) of the FF circuit 91*a* is connected to the input terminal of the inverter circuit 91*b*. The output terminal of the inverter circuit 91*b* is connected to the data input terminal of the FF circuit 91*a*.

In a period of time when the enable signal C00 is the H level, the FF circuit 91*a* outputs expected value data ED that has the same level as the data input terminal at the timing of the rising edge of the core clock signal CKc. The inverter circuit 91*b* provides a logically inverse signal of the expected value data EC to the FF circuit 91*a*.

The determination circuit 38 also includes exclusive OR (ExOR) circuits 920 to 927. The expected value data ED is provided to the ExOR circuits 920 to 927. Additionally, the determination data CT0 to CT7 are provided to the ExOR circuits 920 to 927, respectively. The ExOR circuit 920 compares the expected value data ED with the determination data CT0 and generates a determination signal EX0 that has the level corresponding to the comparison result. The ExOR circuit 920 generates an L-level determination signal EX0 when the logical value of the expected value data ED is the same as the logical value of the determination data CT0 and generates an H-level determination signal EX0 when the logical value of the expected value data ED differs from the logical value of the determination data CT0. In the same manner, the ExOR circuits 921 to 927 respectively generate L-level determination signals EX1 to EX7 when the logical value of the expected value data ED is the same as the logical values of the determination data CT1 to CT7. The ExOR circuits 921 to 927 respectively generate H-level determination signals EX1 to EX7 when the logical value of the expected value data ED differs from the logical values of the determination data CT1 to CT7.

The set value calculation circuit 39 generates the transfer set value FSP and the latency set value FSL based on the transfer initial value FSO and the determination signals EX0 to EX7.

The determination circuit 38, which generates the determination signals EX0 to EX7, is arranged to determine whether or not the latch timing of the second latch circuit 37*b* illustrated in FIG. 2, or the timing for generating the enable signals C00 to C03, is appropriate to the delay strobe signal DQSd. Thus, the set value calculation circuit 39 only needs to use a determination signal that is generated based on one of the enable signals C00 to C03.

The set value calculation circuit 39 uses, for example, the determination signals EX0, EX1, to calculate the transfer set value FSP and the latency set value FSL. The determination data CT0 is one example of first determination data. The determination data CT1 is one example of second determination data. The determination signal EX0 is one example of a first determination signal. The determination signal EX1 is one example of a second determination signal. The set value calculation circuit 39 calculates a correction value based on the values of the determination signals EX0, EX1. For example, when the value of the determination signals EX0, EX1 is "00," the correction value is set to "0." When the value of the determination signals EX0, EX1 is "01," the connection value is set to "+1." When the value of the determination signals EX0, EX1 is "10," the connection value is set to "−1."

The set value calculation circuit 39 includes a register (not illustrated). The set value calculation circuit 39 initially stores the transfer initial value FSO in the register. The set value calculation circuit 39 calculates a transfer set value FSP based on the correction value derived from the determination signals EX0, EX1 and the value stored in the register. The set value calculation circuit 39 updates the value stored in the register with the transfer set value FSP. The set value calculation circuit 39 also calculates a latency set value FSL based on the transfer set value FSP and stores the calculated latency set value FSL in the register.

The set value calculation circuit 39 updates the transfer set value FSP and the latency set value FSL based on the correction value calculated from the determination signals EX0, EX1. The set value calculation circuit 39, for example, adds the correction value to the transfer set value FSP that is retrieved from the register and stores the addition result in the register as a new transfer set value FSP. The set value calculation circuit 39 outputs the new transfer set value FSP. In the same manner, the set value calculation circuit 39, for example, subtracts the correction value from the latency set value FSL that is retrieved from the register and stores the subtraction result in the register as a new latency set value FSL. The set value calculation circuit 39 outputs the new latency set value FSL.

The latency compensation circuit 34 includes FF circuits 101*a* to 101*m* and a multiplexer 102 (MUX). The FF circuits 101*a* to 101*m* are connected in series. The core clock signal CKc is provided to the clock terminals of the FF circuits 101*a* to 101*m*. The output data CD is provided from the asynchronous transfer circuit 33 to the FF circuit 101*a* in the first stage.

The multiplexer 102 receives output signals CDa to CDm from the FF circuits 101*a* to 101*m*. The multiplexer 102 outputs read data RD that is the same as one of the output signals CDa to CDm in accordance with the latency set value FSL.

Figure 8:
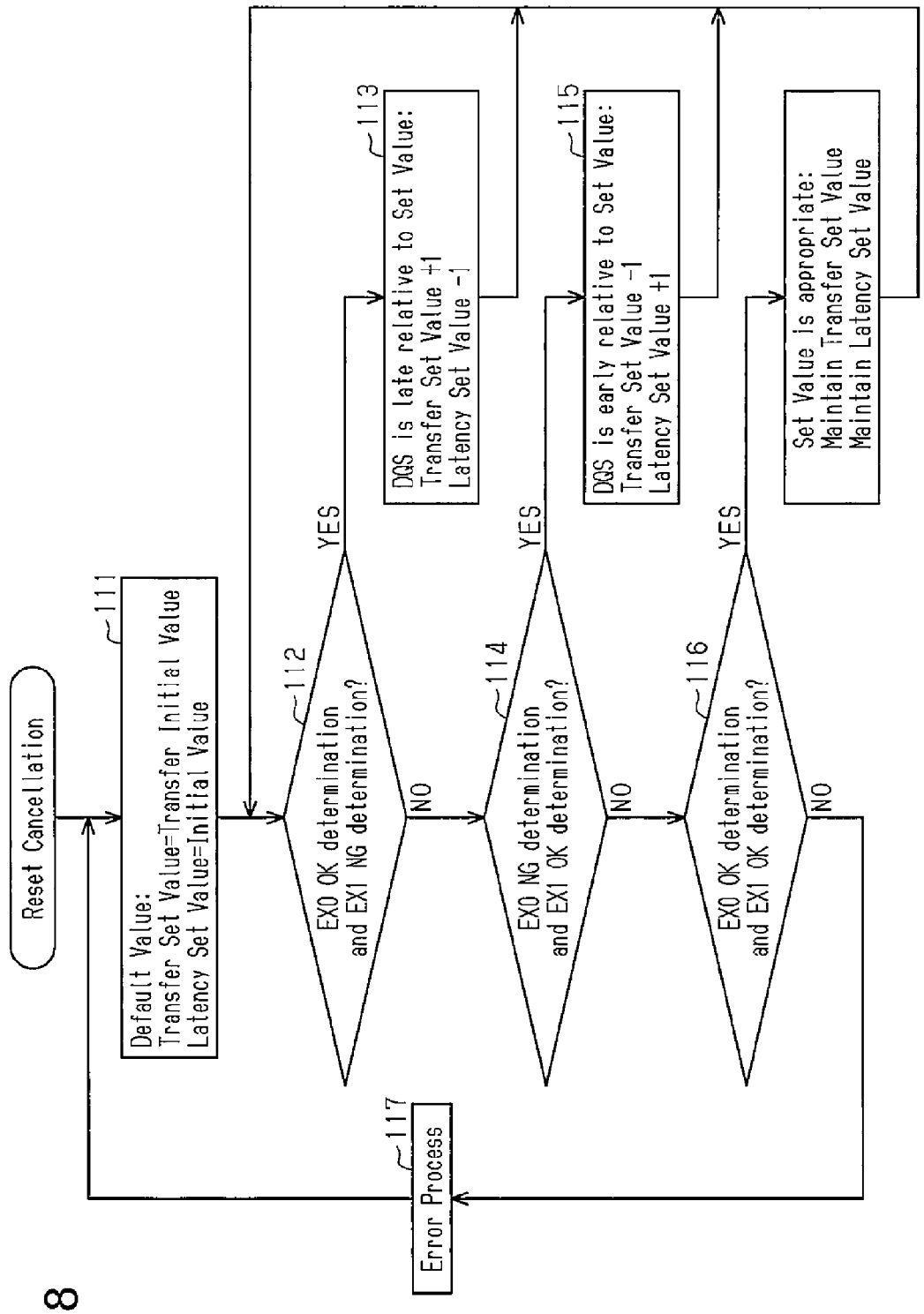
FIG. 8 is a schematic flowchart illustrating an operation of the set value calculation circuit.

FIG. 8 illustrates the process performed by the set value calculation circuit 39.

In step 111, the set value calculation circuit 39 sets a default value. The set value calculation circuit 39 sets the default value of the transfer set value FSP to the transfer initial value FSO, which is provided from the memory controller 21 illustrated in FIG. 1. The set value calculation circuit 39 also calculates a latency initial value corresponding to the transfer set value FSO and sets the default value of the latency set value FSL to the latency initial value.

The set value calculation circuit 39 determines whether each of the determination signals EX0, EX1 output from the determination circuit 38 illustrated in FIG. 7 indicates "OK determination" or "NG determination." In the description, "NG" refers to no good, or the opposite of "OK." When the values of the determination signals EX0, EX1 are each "0," the set value calculation circuit 39 determines that the determination signals EX0, EX1 indicate "OK determination." When the values of the determination signals EX0, EX1 are each "1," the set value calculation circuit 39 determines that the determination signals EX0, EX1 indicate "NG determination."

In step 112, when the determination signal EX0 indicates "OK determination" and the determination signal EX1 indicates "NG determination," the set value calculation circuit 39 proceeds to step 113. The proceeding to step 113 is performed when "the DQS is late relative to the set value (clock replacement timing)." In step 113, the set value calculation circuit 39 adds "+1" to the transfer set value FSP and "−1" to the latency set value FSL. Then, the set value calculation circuit 39 proceeds to step 112.

In step 114, when the determination signal EX0 indicates "NG determination" and the determination signal EX1 indicates "OK determination," the set value calculation circuit 39 proceeds to step 115. The proceeding to step 115 is performed when "the DQS is early relative to the set value." In step 115, the set value calculation circuit 39 adds "−1" to the transfer set value FSP and "+1" to the latency set value FSL. The set value calculation circuit 39 proceeds to step 112.

In step 116, when the determination signal EX0 indicates "OK determination" and the determination signal EX1 indicates "OK determination," the set value calculation circuit 39 determines that "the DQS is appropriate to the set value." Thus, the set value calculation circuit 39 maintains the transfer set value FSP and the latency set value FSL and proceeds to step 112.

In step 116, when the determination signal EX0 and the determination signal EX1 both indicate "NG determination," the set value calculation circuit 39 executes step 117. In step 117, the set value calculation circuit 39 executes an error process and proceeds to step 111. In the error process, the set value calculation circuit 39, for example, notifies error information to the memory controller 21 illustrated in FIG. 1. The memory controller 21 executes the training process based on the error information and resets the transfer set value FSP based on the process result.

The operation of the reception circuit 24 will now be described.

Figure 9:
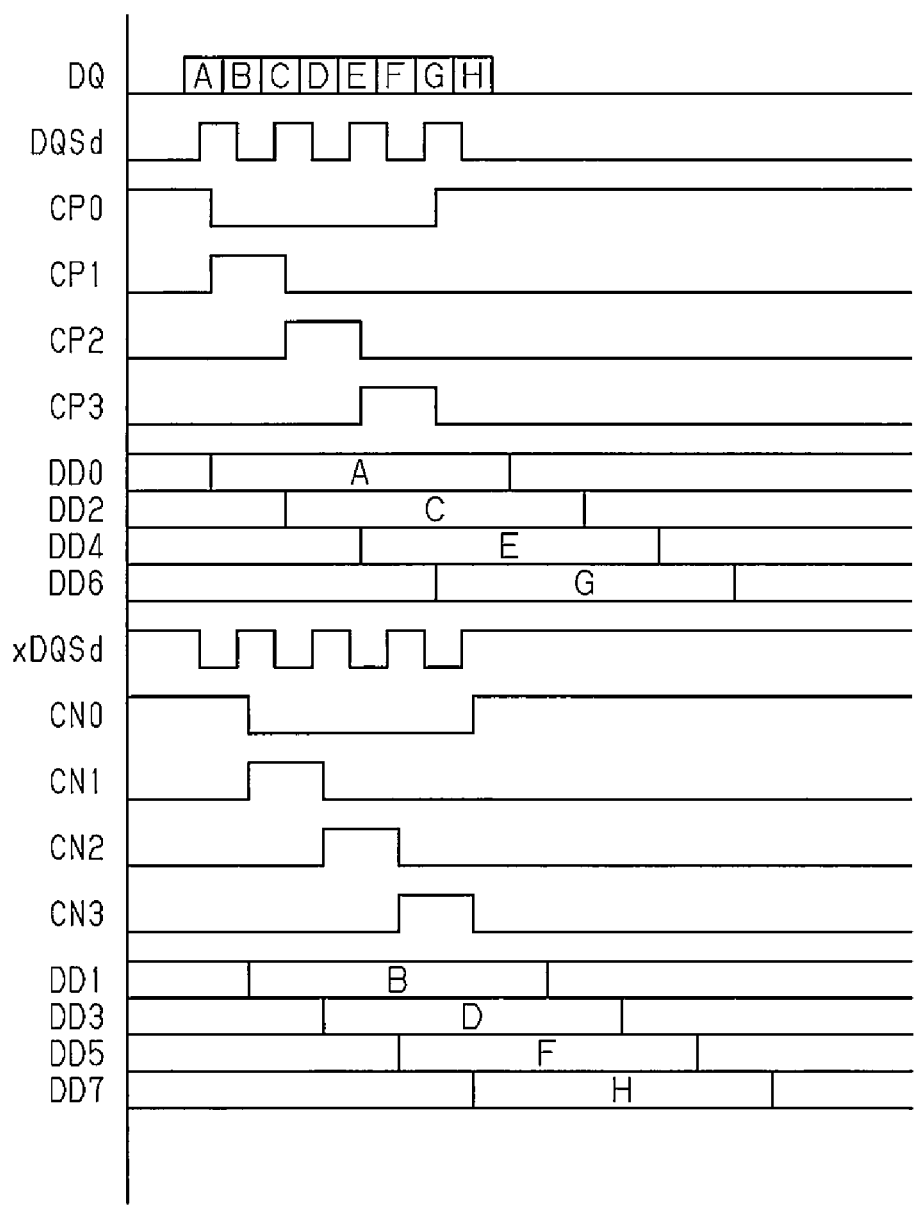
FIG. 9 is a schematic timing chart illustrating an operation of the asynchronous transfer circuit.

As illustrated in FIG. 9, the data DQ is output from the memory 12 illustrated in FIG. 1. The data DQ includes data having the burst length. In FIG. 9, the data DQ includes data [A] to [H].

The reception circuit 24 illustrated in FIG. 1 delays the data strobe signal DQS (reception strobe signal RDQS) and generates the delay strobe signal DQSd.

Figure 3:
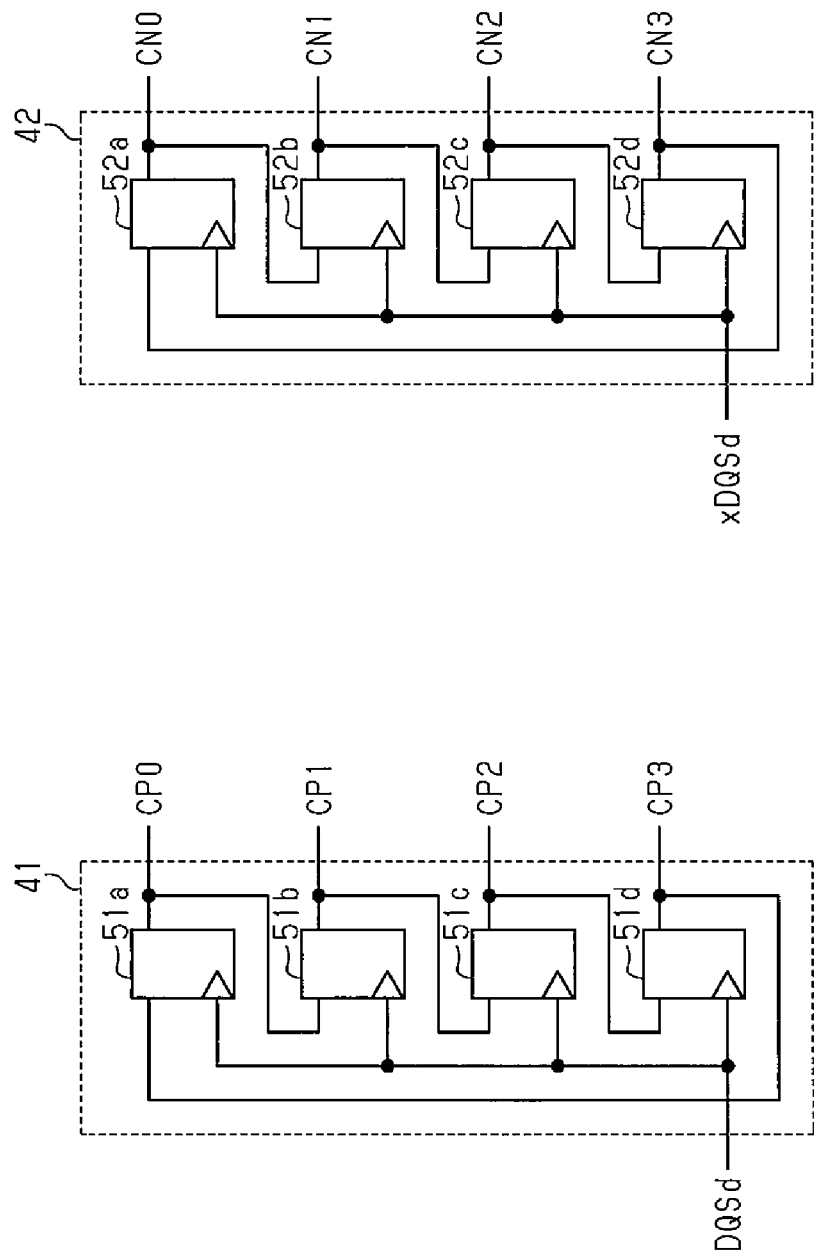
FIGS. 3A and 3B are schematic circuit diagrams illustrating first and second BL counters of a control signal generation circuit.

The BL counter 41 illustrated in FIG. 3 counts rising edges of the delay strobe signal DQSd and generates the enable signals CP0 to CP3. In the asynchronous transfer circuit 33 illustrated in FIG. 5, when receiving the H-level enable signal CP0, the FF circuit 610 latches the data [A] at a rising edge of the delay strobe signal DQSd. In the same manner, when receiving the H-level enable signals CP1, CP2, CP3, the FF circuits 612, 614, 616 latch the data [C], [E], [G] at a rising edge of the delay strobe signal DQSd. The FF circuits 610, 612, 164, 616 hold the data [A], [C], [E], [G] until a rising edge of the delay strobe signal DQSd that is generated when receiving the next data DQ.

In the same manner, the BL counter 42 illustrated in FIG. 3 counts falling edges of the delay strobe signal DQSd (rising edges of inverse strobe signal xDQSd) and generates the enable signals CN0 to CN3. In the asynchronous transfer circuit 33 illustrated in FIG. 5, when receiving the H-level enable signal CN0, the FF circuit 611 latches the data [B] at a falling edge of the delay strobe signal DQSd (rising edge of inverse strobe signal xDQSd). In the same manner, when receiving the H-level enable signals CN1, CN2, CN3, the FF circuits 613, 615, 617 latch the data [D], [F], [H] at a falling edge of the delay strobe signal DQSd (rising edge of inverse strobe signal xDQSd). The FF circuits 611, 613, 165, 617 hold the data [B], [D], [F], [H] until a falling edge of the delay strobe signal DQSd that is generated when receiving the next data DQ.

As illustrated in FIG. 9, the timewise width of each of the data DQ [A] to [H] is one-half cycle, or a ½ cycle, of the delay strobe signal DQSd. The asynchronous transfer circuit 33 (first latch circuit 33a) illustrated in FIG. 2 extends the timewise width of each of the data [A] to [H] to a four-cycle width or longer.

Figure 10:
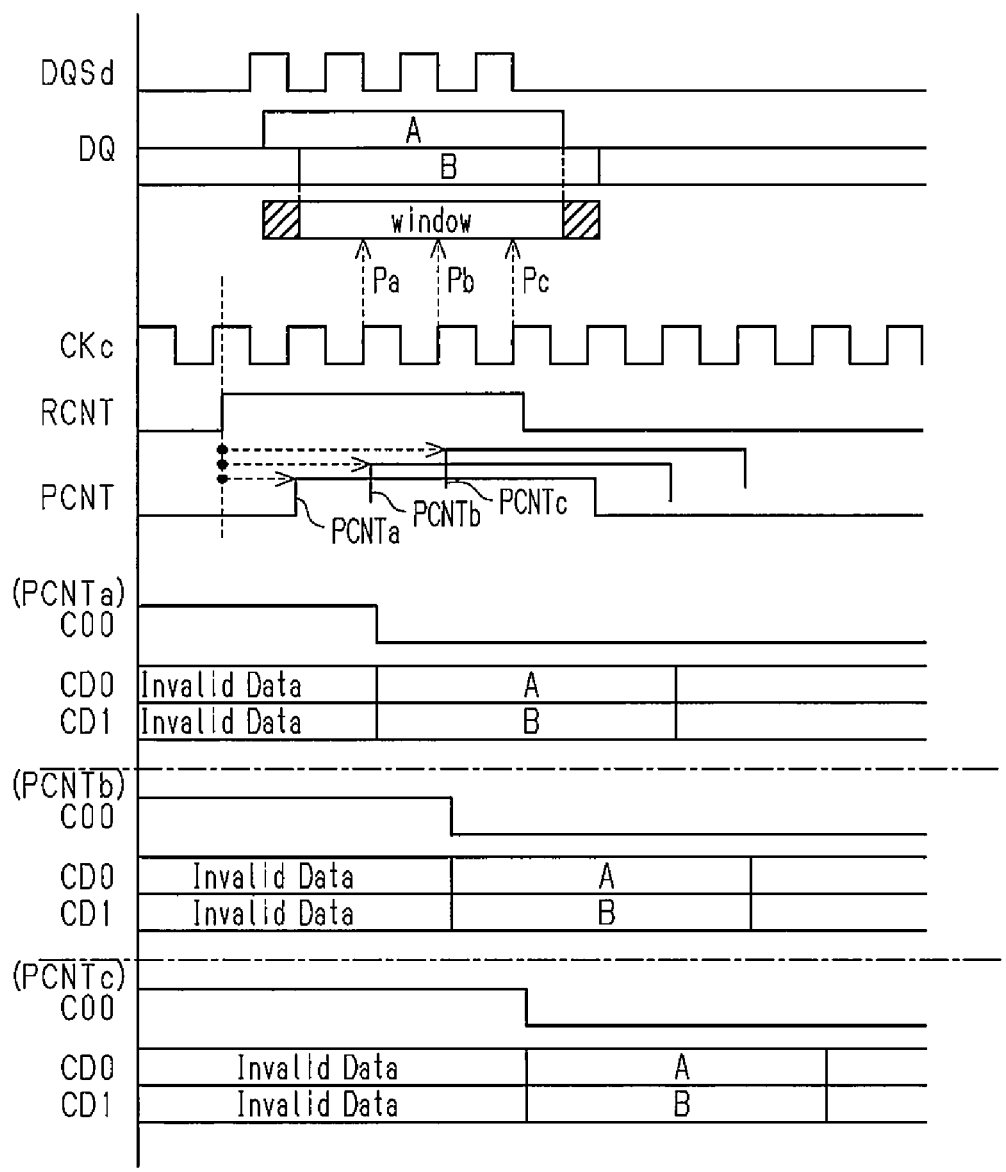
FIG. 10 is a schematic timing chart illustrating the process for setting a transfer set value.

As illustrated in FIG. 10, the data [A] is latched at a rising edge of the delay strobe signal DQSd. The data [B] is latched at a falling edge of the delay strobe signal DQSd. FIG. 10 illustrates the data [A] [B] each of which has the four-cycle width.

As described above, in the asynchronous transfer circuit 33 illustrated in FIG. 2, the first latch circuit 33a holds the latched data until a rising edge of the delay strobe signal DQSd corresponding to the next data DQ. In the system 10 illustrated in FIG. 1, the device 11 is capable of performing a continuous read operation from the memory 12. In such a continuous read operation, the memory 12 continuously outputs the data DQ and the data strobe signal DQS. For example, when the burst length is set to "8," the first latch circuit 33a illustrated in FIG. 2 holds data for four cycles of the delay strobe signal DQSd. Subsequently, the asynchronous transfer circuit 33 (second latch circuit 33b) illustrated in FIG. 2 latches the data [A] [B] in accordance with the core clock signal CKc. Thus, the asynchronous transfer circuit 33 needs to latch output data DD of the first latch circuit 33a using the second latch circuit 33b in the four cycles of the delay strobe signal DQSd. In other words, in the four cycles of the delay strobe signal DQSd, the output data DD needs to be transferred from the first latch circuit 33a to the second latch circuit 33b.

The data [A] [B] are shifted from each other by one-half cycle of the delay strobe signal DQSd. This allows the data [A] [B] to be simultaneously transferred in a range of the "window" illustrated in FIG. 10. The timewise width of the window is 3.5 cycles of the delay strobe signal DQSd. Thus, the asynchronous transfer circuit 33 (second latch circuit 33b) retrieves the data [A] [B] at one of the three timings indicated by arrows in FIG. 10 in accordance with the core clock signal CKc. The memory controller 21 illustrated in FIG. 1 sets the transfer initial value FSO to one of the timings through the training process.

For example, as illustrated in FIG. 10, the transfer initial value FSO is set to "Pa." The read control signal RCNT is delayed based on "Pa" by the pointer control circuit 43 illustrated in FIG. 4 and provided to the BL counter 44 as the pointer control signal PCNT (in FIG. 10, PCNTa). The BL counter 44 counts the core clock signals CKc and generates an enable signal C00. The second latch circuit 33b of the asynchronous transfer circuit 33 illustrated in FIG. 6 is enabled by the enable signal C00 and latches the data [A] [B] at a rising edge of the core clock signal CK.

As illustrated in FIG. 10, when the transfer initial value FSO is set to "Pb," the data [A] [B] are latched based on an enable signal C00 generated from a pointer control signal PCNTb and the core clock signal CKc. When the transfer initial value FSO is set to "Pc," the data [A] [B] are latched based on an enable signal C00 generated from a pointer control signal PCNTc and the core clock signal CKc.

A comparison example of a system will now be described.

The same reference characters are given to components of the comparison example that are the same as the corresponding components of the system 10. Such components will now be described in detail.

Figure 15:
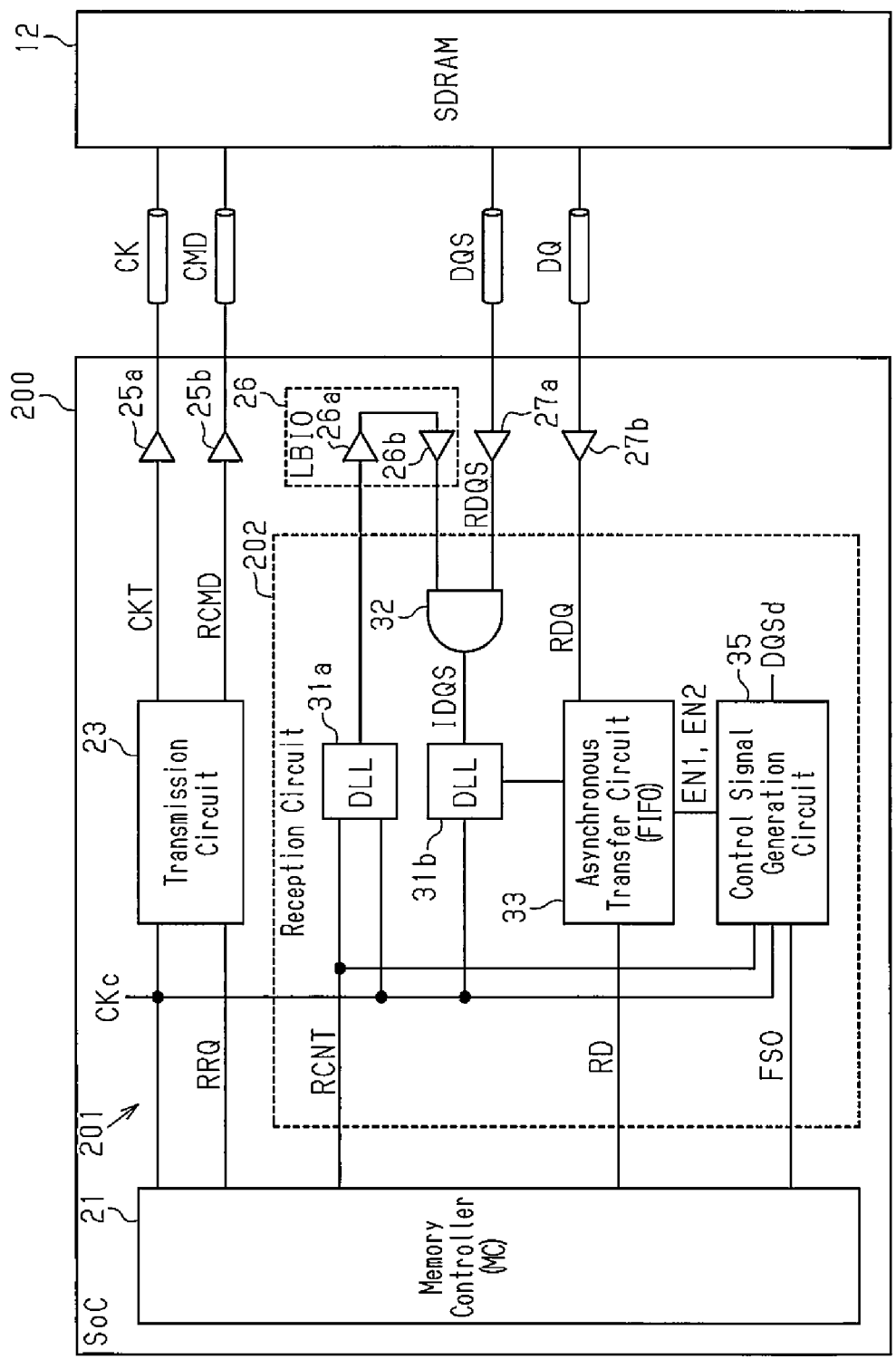
FIG. 15 is a block circuit diagram illustrating an comparison example of a system in the related art.

As illustrated in FIG. 15, the system of the comparison example includes a device 200 that includes the memory controller 21 and an interface circuit 201. The interface circuit 201 includes the transmission circuit 23 and a reception circuit 202.

In the same manner as the control signal generation circuit 35 illustrated in FIG. 1, the control signal generation circuit 35 of the reception circuit 202 counts the delay strobe signals DQSd and generates the enable signal EN1. The control signal generation circuit 35 also counts the core clock signals CKc provided from the memory controller 21 and generates the enable signal EN2 based on the transfer initial value FSO.

The asynchronous transfer circuit 33 of the reception circuit 202 enables the input function based on the enable signal EN1 and latches the reception data RDQ in accordance with the delay strobe signal DQSd. The asynchronous transfer circuit 33 enables the output function based on the enable signal EN2 and outputs the read data RD in accordance with the latched data.

For example, the memory 12 includes memory chips, and each of the data [A] [H] (refer to FIG. 9) includes bits (e.g., sixteen bits). In such data, the timing for receiving the data DQ and the data strobe signal DQS of each bit, or the round trip time (RTT), varies.

Figure 16:
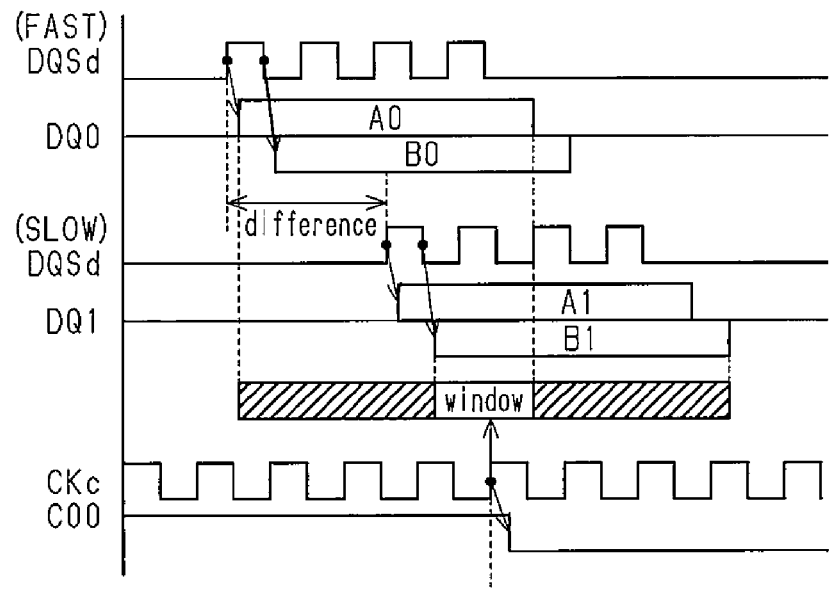
FIG. 16 is a schematic timing chart illustrating an window and the transfer set value relative to variations in data.

For example, as illustrated in FIG. 16, data [A0] [B0] may be latched based on the delay strobe signal DQSd and data DQ0 that are output when the round trip time (RTT) is the shortest (FAST). Also, data [A1] [B1] may be latched based on the delay strobe signal DQSd and data DQ1 that are output when the round trip time (RTT) is the longest (SLOW).

Such round trip time (RTT) variations occur due to various variations (e.g., variations in resistance value of wires included in chip) caused by the process for manufacturing the device 200 and the memory 12 of the system. The RTT variations cause the window (valid window) in which the data [A0] [B0] [A1] [B1] is simultaneously retrieved to be narrower than the ideal window, which is obtained when reception bits all have the same round trip time.

Figure 17:
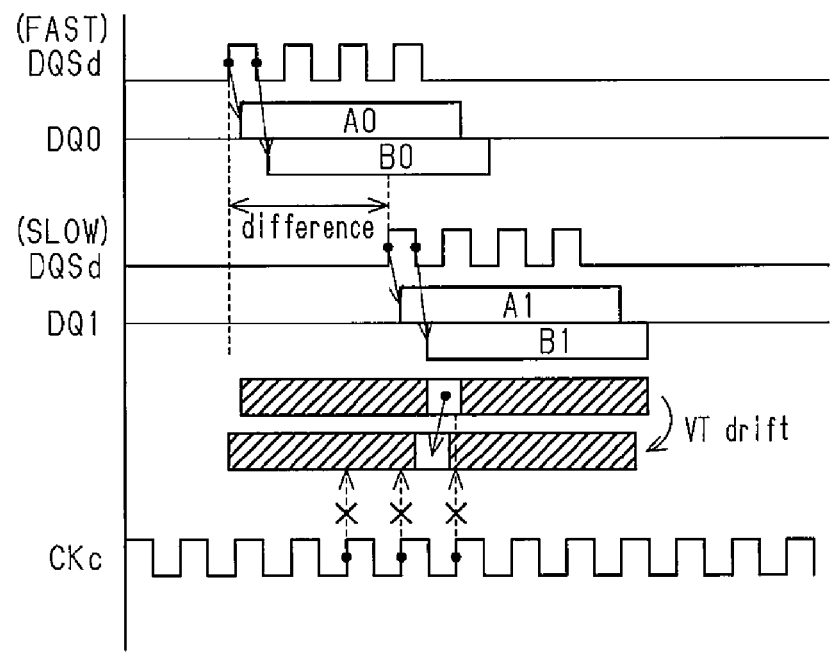
FIG. 17 is a schematic timing chart illustrating windows and the transfer set value at a high rate.

Additionally, as illustrated in FIG. 17, the window is narrowed when the rate for transferring the data DQ between the device 200 and the memory 12 increases, that is, when one cycle of the data strobe signal DQS shortens. When the window width becomes shorter than one cycle of the core clock signal CKc, the window position may be deviated from a position corresponding to the retrieval timing that is set based on the core clock signal CKc due to the VT drift (variations in voltage such as power supply voltage or temperature such as operation environment temperature). This causes an error in the read data RD.

The device 11 (reception circuit 24) of the system illustrated in FIG. 1 reduces such errors of the read data RD. The operation of the device 11 will now be described.

Figure 11:
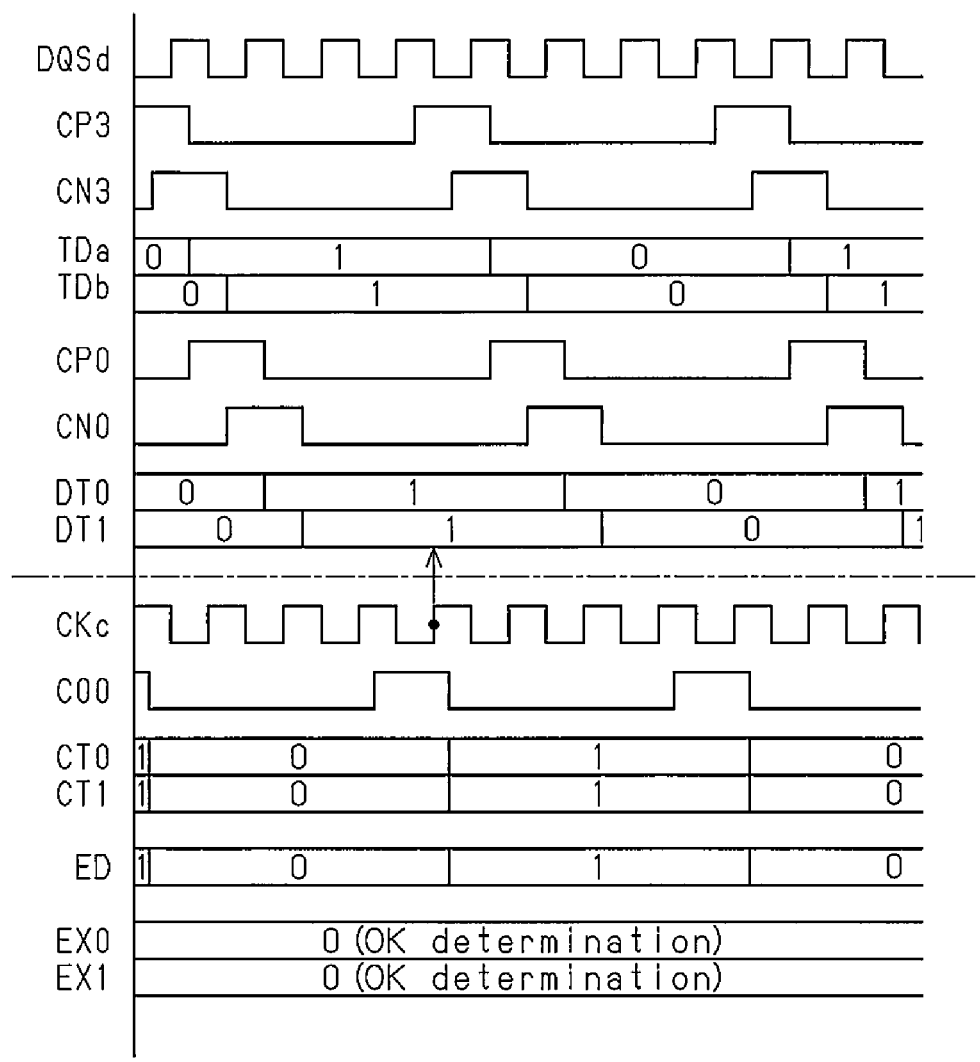
FIGS. 11 to 13 are schematic timing charts illustrating operations of the pattern data generation circuit, the asynchronous transfer circuit, and the determination circuit.

As illustrated in FIG. 6, in the pattern data generation circuit 36, the FF circuit 71a of the first data generation circuit 36a enables the function based on the enable signal CP3 and outputs the determination pattern data TDa that has the same level as the signal of the input terminal (data terminal D) in accordance with a rising edge of the delay strobe signal DQSd. The inverter circuit 72a outputs a logically inverse signal of the determination pattern data TDa. Thus, as illustrated in FIG. 11, when the delay strobe signals DQSd are consecutively generated, the determination pattern data TDa changes from "0" to "1" or from "1" to "0" in each four cycles of the delay strobe signal DQSd. That is, the determination pattern data TDa alternates between "0" and "1" in each four cycles.

In the same manner, the FF circuit 71b of the second data generation circuit 36b illustrated in FIG. 6 enables the function based on the enable signal CN3 and outputs the determination pattern data TDb that has the same level as the signal of the input terminal (data terminal D) in accordance with a rising edge of the inverse strobe signal xDQSd, or a falling edge of the delay strobe signal DQSd. The inverter circuit 72b outputs a logically inverse signal of the determination pattern data TDb. Thus, as illustrated in FIG. 11, the determination pattern data TDb changes from "0" to "1" or from "1" to "0" in each four cycles of the delay strobe signal DQSd. That is, the determination pattern data TDb alternates between "0" and "1" in each four cycles.

The FF circuit 810 of the first latch circuit 37a illustrated in FIG. 6 enables the function based on the enable signal CP0 and latches the determination pattern data TDa at a rising edge of the delay strobe signal DQSd. The FF circuit 810 outputs the transfer signal DT0 that has the same level as the latched data TDa. The FF circuit 811 enables the function based on the enable signal CN0 and latches the determination pattern data TDb at a rising edge of the inverse strobe signal xDQSd (falling edge of the delay strobe signal DQSd). The FF circuit 811 outputs the transfer signal DT1 that has the same level as the latched data TDb.

Thus, as illustrated in FIG. 11, in the same manner as the determination pattern data TDa, TDb, each of the transfer signals DT0, DT1 alternates between "0" and "1" in each four cycles. The phases of the transfer signals DT0, DT1, or the timings when the values of the transfer signals DT0, DT1 change, are shifted from each other by one-half cycle of the delay strobe signal DQSd.

The FF circuit 820 of the second latch circuit 37b illustrated in FIG. 6 enables the function based on the enable signal C00 and latches the transfer signal DT0 at a rising edge of the core clock signal CKc. The FF circuit 820 outputs the determination data CT0 that has the same level as the latched transfer signal DT0. In the same manner, the FF circuit 821 enables the function based on the enable signal C00 and latches the transfer signal DT1 at a rising edge of the core clock signal CKc. The FF circuit 821 outputs the determination data CT1 that has the same level as the latched transfer signal DT1.

Thus, as illustrated in FIG. 11, when the enable signal C00 is set at the timing of the core clock signal CKc that is indicated by the arrow, each of the determination data CT0, CT1 simultaneously alternates between "0" and "1" in each four cycles of the core clock signal CKc.

The FF circuit 91a of the determination circuit 38 illustrated in FIG. 7 enables the function based on the enable signal C00 and outputs the expected value data ED that has the same level as the signal of the input terminal (data terminal D) at a rising edge of the core clock signal CKc. The inverter circuit 91b outputs a logically inverse signal of the expected value data ED. Thus, as illustrated in FIG. 11, the expected value data ED changes from "0" to "1" or from "1" to "0" in each four cycles of the core clock signal CKc. That is, the expected value data ED alternates between "0" and "1" in each four cycles.

The ExOR circuit 920 of the determination circuit 38 compares (performs ExOR operation on) the expected value data ED and the determination data CT0 and generates the determination signal EX0. The ExOR circuit 921 compares (performs ExOR operation on) the expected value data ED and the determination data CT1 and generates the determination signal EX1. Thus, as illustrated in FIG. 11, when the transfer set value FSP is at the timing indicated by the arrow, the determination signals EX0, EX1 are both "0" (OK determination). The "OK determination" indicates that the timing of the transfer set value FSP conforms to the window that is set based on the delay strobe signal DQSd.

In this case, the set value calculation circuit 39 illustrated in FIG. 7 determines that step 116 illustrated in FIG. 8 is "YES" based on the determination signals EX0, EX1 and maintains the transfer set value FSP and the latency set value FSL.

Figure 12:
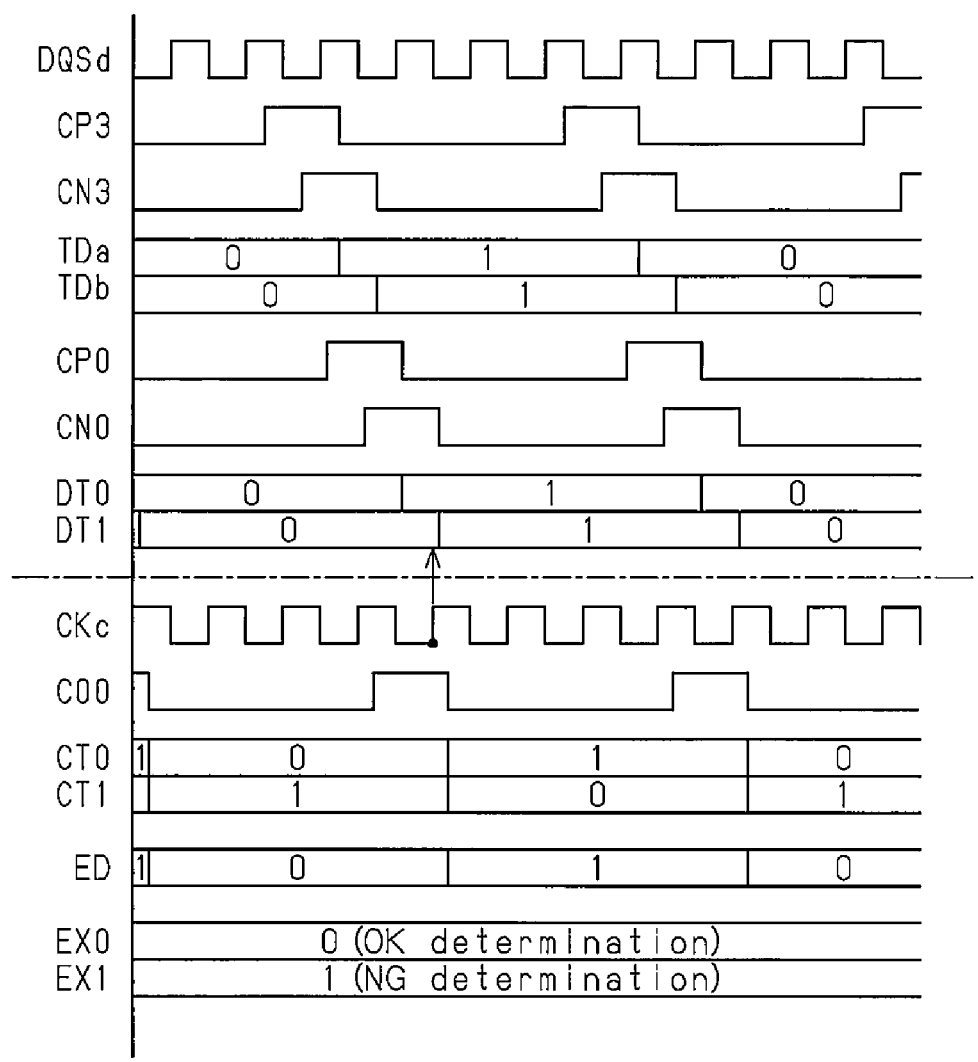

As illustrated in FIG. 12, when the delay strobe signal DQSd is retarded due to the VT drift, the value of the determination data CT0 is "1" when the transfer signal DT0 is retrieved. Here, the value of the expected value data ED is "1." Thus, the value of the determination signal EX0 is "0." The determination signal EX0 having "0" indicates "OK determination." The value of the determination data CT1 is "0" when the transfer signal DT1 is retrieved at the timing indicated by the arrow. Since the value of the expected value data ED is "1," the value of the determination signal EX1 is "1." The determination signal EX1 having "1" indicates "NG determination."

In this case, the set value calculation circuit 39 determines that step 112 illustrated in FIG. 8 is "YES" based on the determination signals EX0, EX1 and adds "+1" to the transfer set value FSP and "−1" to the latency set value FSL. Consequently, in FIG. 12, the transfer set value FSP is set to the rising edge that is shifted by one clock to the right from the arrow. Namely, the reception circuit 24 retards the latch timing, or the transfer timing, of the second latch circuit 33b of the asynchronous transfer circuit 33 in accordance with the retardation of the delay strobe signal DQSd. As a result, the determination signals EX0, EX1 both indicate "1." In this manner, the set value calculation circuit 39 changes the transfer set value FSP in accordance with the retardation of the delay strobe signal DQSd. In other words, the retrieval timing obtained based on the core clock signal CKc is changed by changing the transfer set value FSP corresponding to the VT drift. Thus, the asynchronous transfer circuit 33 illustrated in FIG. 1 latches the data at the timing of the transfer set value FSP and outputs the error-free output data CD in correspondence with the window that is set based on the delay strobe signal DQSd.

The latency compensation circuit 34 illustrated in FIG. 7 outputs the read data RD based on the latency set value FSL (value changed by adding "−1"). The output timing of the read data RD is advanced by one cycle of the core clock signal CKc compared to before the latency set value FSL is changed. Thus, the reception circuit 24 retards the transfer timing of the asynchronous transfer circuit 33 by one cycle and shortens the delay time of the latency compensation circuit 34 by one cycle. Consequently, the output timing of the read data RD becomes the same as that before the transfer set value FSP is changed. In this manner, the reception circuit 24 compensates for the latency relative to the transfer timing and maintains the fixed latency of the read data RD to the memory controller 21.

Figure 13:
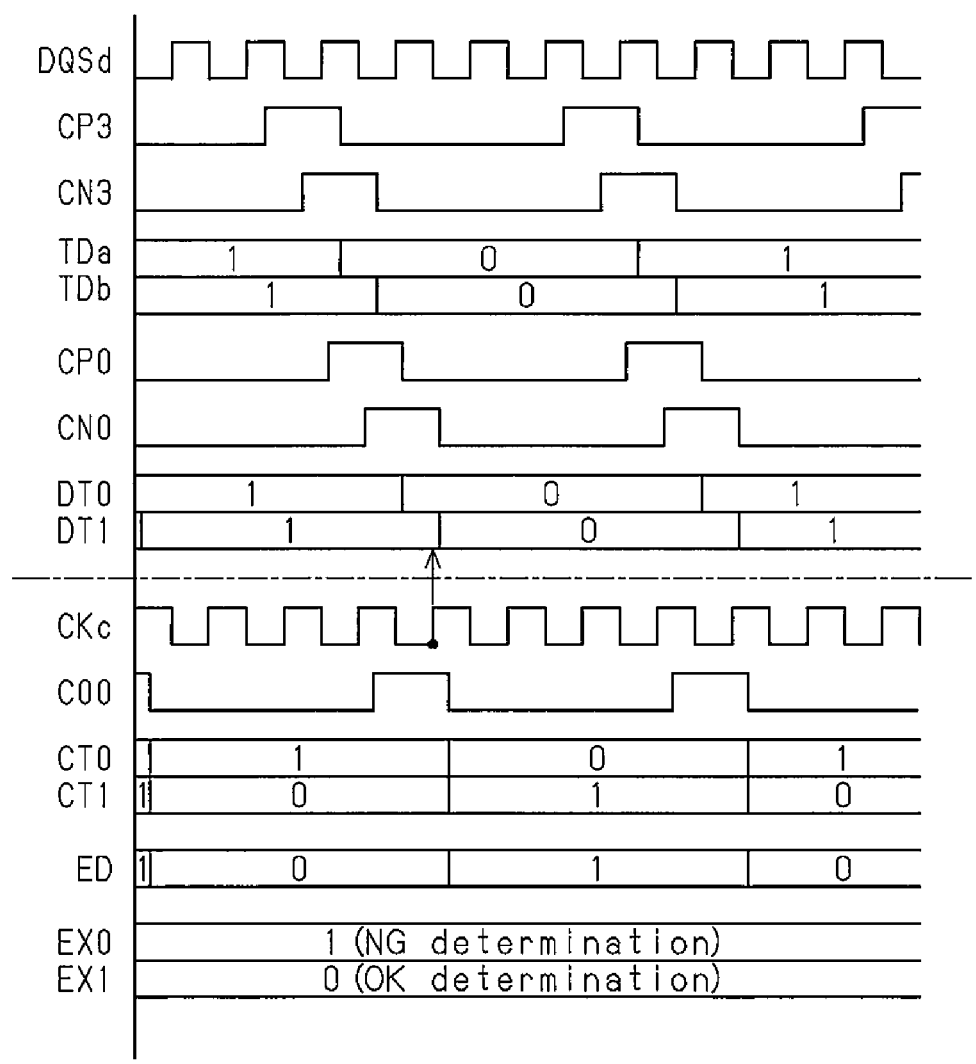

As illustrated in FIG. 13, when the delay strobe signal DQSd is advanced due to the VT drift, the value of the determination data CT0 is "0" when the transfer signal DT0 is retrieved at the timing indicated with the arrow. In this case, the value of the expected value data ED is "1." Thus, the determination signal EX0 is "1." The determination signal EX0 having "1" indicates "NG determination." The value of the determination data CT1 is "1" when the transfer signal DT1 is retrieved. Since the value of the expected value data ED is "1," the value of the determination signal EX1 is "0." The determination signal EX1 having "0" indicates "OK determination."

In this case, the set value calculation circuit 39 illustrated in FIG. 7 determines that step 114 illustrated in FIG. 8 is "YES" based on the determination signals EX0, EX1 and adds "−1" to the transfer set value FSP and "+1" to the latency set value FSL. Consequently, in FIG. 13, the transfer set value FSP is set to the rising edge that is shifted to the left from the arrow by one clock. Namely, the reception circuit 24 advances the latch timing, or the transfer timing, of the second latch circuit 33b of the asynchronous transfer circuit 33 in accordance with the advancement of the delay strobe signal DQSd. As a result, the determination signals EX0, EX1 both indicate "1." In this manner, the set value calculation circuit 39 changes the transfer set value FSP in accordance with the advancement of the delay strobe signal DQSd. In other words, the retrieval timing obtained based on the core clock signal CKc is changed by changing the transfer set value FSP in correspondence with the VT drift. Thus, the asynchronous transfer circuit 33 illustrated in FIG. 1 latches the data at the timing of the transfer set value FSP and outputs the error-free output data CD in correspondence with the window that is set based on the delay strobe signal DQSd.

The latency compensation circuit 34 illustrated in FIG. 7 outputs the read data RD based on the latency set value FSL (value changed by adding "+1"). The output timing of the read data RD is retarded by one cycle of the core clock signal CKc compared to before the latency set value FSL is changed. Thus, the reception circuit 24 advances the transfer timing of the asynchronous transfer circuit 33 by one cycle and extends the delay time of the latency compensation circuit 34 by one cycle. Consequently, the output timing of the read data RD becomes the same as that before the transfer set value FSP is changed. In this manner, the reception circuit 24 compensates for the latency relative to the transfer timing and maintains the fixed latency of the read data RD to the memory controller 21.

Figure 14:
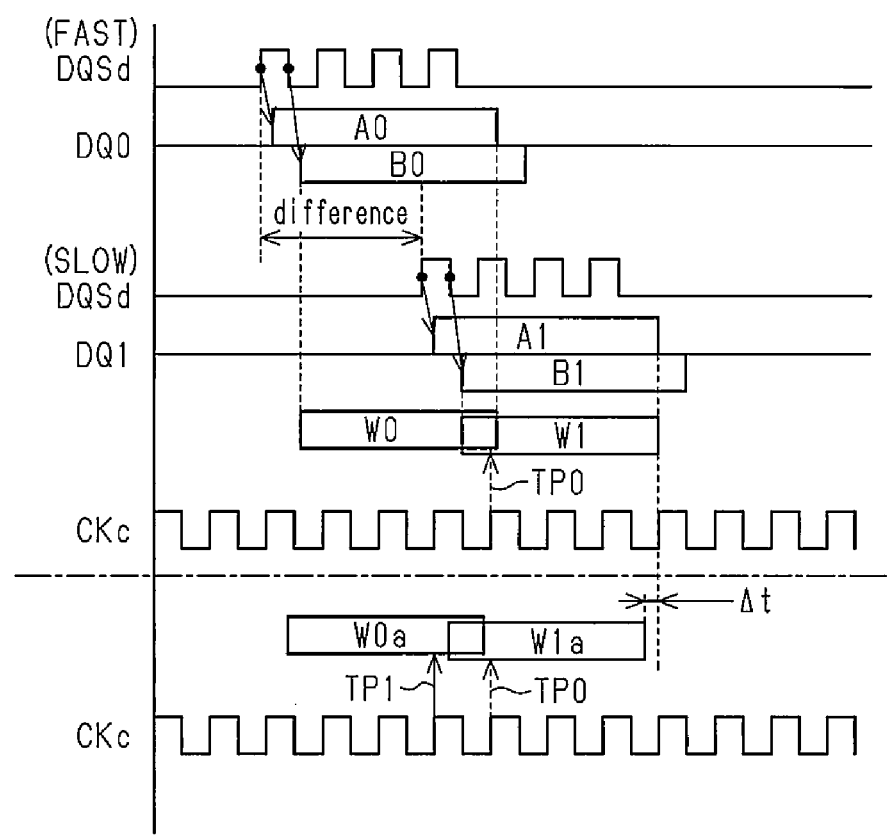
FIG. 14 is a schematic timing chart illustrating an operation of the reception circuit.

As illustrated in FIG. 14, data [A0] [B0] may be latched based on the delay strobe signal DQSd and the data DQ0 that are output when the round trip time (RTT) is the shortest (FAST). Also, data [A1] [B1] may be latched based on the delay strobe signal DQSd and the data DQ1 that are output when the round trip time (RTT) is the longest (SLOW).

The memory controller 21 illustrated in FIG. 1 sets the transfer set value FSP based on a window W0 corresponding to the data [A0] [B0] and a window W1 corresponding to the data [A1] [B1]. In this case, the determination circuit 38 performs the determination process on the data DQ0, DQ1 and outputs the determination signals EX0, EX1 indicating "OK determination."

As illustrated in FIG. 14 below the single-dashed lines, the VT drift timewise shifts windows W0a, W1a from the windows W0, W1 by Δt. In this case, the retrieval timing TP0 based on the transfer set value FSP is in the range of the window W1a. Thus, the data [A1] [B1] are retrieved at timing TP0.

Timing TP0 is outside the range of the window W0a. Thus, when the data is continuously retrieved at timing TP0, an error occurs in the read data.

In the present embodiment, when performing the determination process on the data DQ0, the determination circuit 38 outputs the determination signal EX0 indicating "NG determination." The set value calculation circuit 39 illustrated in FIG. 7 adds "−1" to the transfer set value FSP based on the determination signal EX0 and calculates a new transfer set value FSP. Based on the new transfer set value FSP, timing TP1 illustrated in FIG. 14 is calculated. As a result, timing TP1 is adjusted in the range of the window W0a. Thus, the data [A0] [B0] is retrieved at timing TP1.

In this manner, the reception circuit 24 of the present embodiment retrieves the data [A0] [B0] at timing TP1 and the data [A1] [B1] at timing TP0. Thus, the reception circuit 24 substantially widens the window for retrieving the data DQ0, DQ1. The widened window allows for a stable domain change from the delay strobe signal DQSd to the core clock signal CKc and reduces errors in the read data RD.

Accordingly, the first embodiment has the advantages described below.

(1-1) The control signal generation circuit 35 of the reception circuit 24 generates the enable signal EN1 based on the delay strobe signal DQSd (strobe signal DQS) and the enable signal EN2 based on the transfer set value FSP, the read control signal RCNT, and the core clock signal CKc. The asynchronous transfer circuit 33 latches the reception data RDQ based on the enable signal EN1 and the delay strobe signal DQSd and outputs the output data CD based on the enable signal EN2 and the core clock signal CKc. The pattern data generation circuit 36 (PG) generates the determination pattern data TD from the enable signal EN1 and inverts the logic of the determination pattern data TD in accordance with changes in the enable signal EN1. The asynchronous transfer circuit 37 latches the determination pattern data TD based on the enable signal EN1 and the delay strobe signal DQSd and outputs the determination data CT based on the enable signal EN2 and the core clock signal CKc. The determination circuit 38 determines the generation timing of the pointer control signal PCNT based on the determination data CT and generates the determination signal EX. The set value calculation circuit 39 calculates the transfer set value FSP based on the determination signal EX provided from the determination circuit 38. The pointer control signal PCNT is generated (updated) based on the transfer set value FSP, the read control signal RCNT, and the core clock signal CKc. The enable signal EN2 is generated (updated) based on the pointer control signal PCNT and the core clock signal CKc.

The asynchronous transfer circuit 37 latches the determination pattern data TD based on the enable signal EN1 and the delay strobe signal DQSd. The latch timing corresponds to the timing when the asynchronous transfer circuit 33 receives the reception data RDQ, or the round trip time (RTT) in which the data is received from the memory 12. The asynchronous transfer circuit 37 latches the transfer signal DT corresponding to the latched data TD based on the enable signal EN2 and the core clock signal CKc and outputs the determination data CT corresponding to the latched transfer signal DT. The value of the determination data CT is changed in accordance with the timing for latching the transfer signal DT based on the enable signal EN2 and the core clock signal CKc, or the timing for changing the domain from the delay strobe signal DQSd to the core clock signal CKc. Thus, when the transfer set value FSP is calculated based on the determination result of the determination data CT, the domain change timing may be adjusted based on the transfer set value FSP. This reduces errors in the output data CD of the asynchronous transfer circuit 33.

(1-2) The set value calculation circuit 39 calculates the latency set value FSL based on the transfer set value FSP. For example, when determining that the DQS is late relative to the set value (clock replacement timing), the set value calculation circuit 39 adds "+1" to the transfer set value FSP and "−1" to the latency set value FSL so that the latency set value FSL corresponds to the transfer set value FSP. The change in the transfer set value FSP retards the timing of the determination data CT that is output from the asynchronous transfer circuit 33. Accordingly, the delay time of the latency compensation circuit 34 is shortened by the latency set value FSL. This stabilizes the output timing of the read data RD, or the timing for sending the read data RD to the memory controller 21. As a result, the latency to the memory controller 21 is compensated.

(1-3) In the same manner as the asynchronous transfer circuit 33, the asynchronous transfer circuit 37 includes the FF circuits 810 to 817, 820 to 827. Thus, the asynchronous transfer circuits 33, 37 have the same state in the wiring through which various signals including the delay strobe signal DQSd are transmitted. The asynchronous transfer circuits 33, 37 transmit signals in the same manner and thus have the same operation timings. This allows the asynchronous transfer circuit 37 to replicate the round trip time (RTT) in which the data DQ is received from the memory 12. The determination data CT, which is output from the asynchronous transfer circuit 37, is used to accurately adjust the generation timing of the pointer control signal PCNT, or the timing when the asynchronous transfer circuit 33 generates the enable signals C00 to C03.

Second Embodiment

A second embodiment will now be described. The same reference characters are given to components of the second embodiment that are the same as the corresponding components of the first embodiment. Such components will not be described in detail and may be omitted from the drawings.

Figure 18:
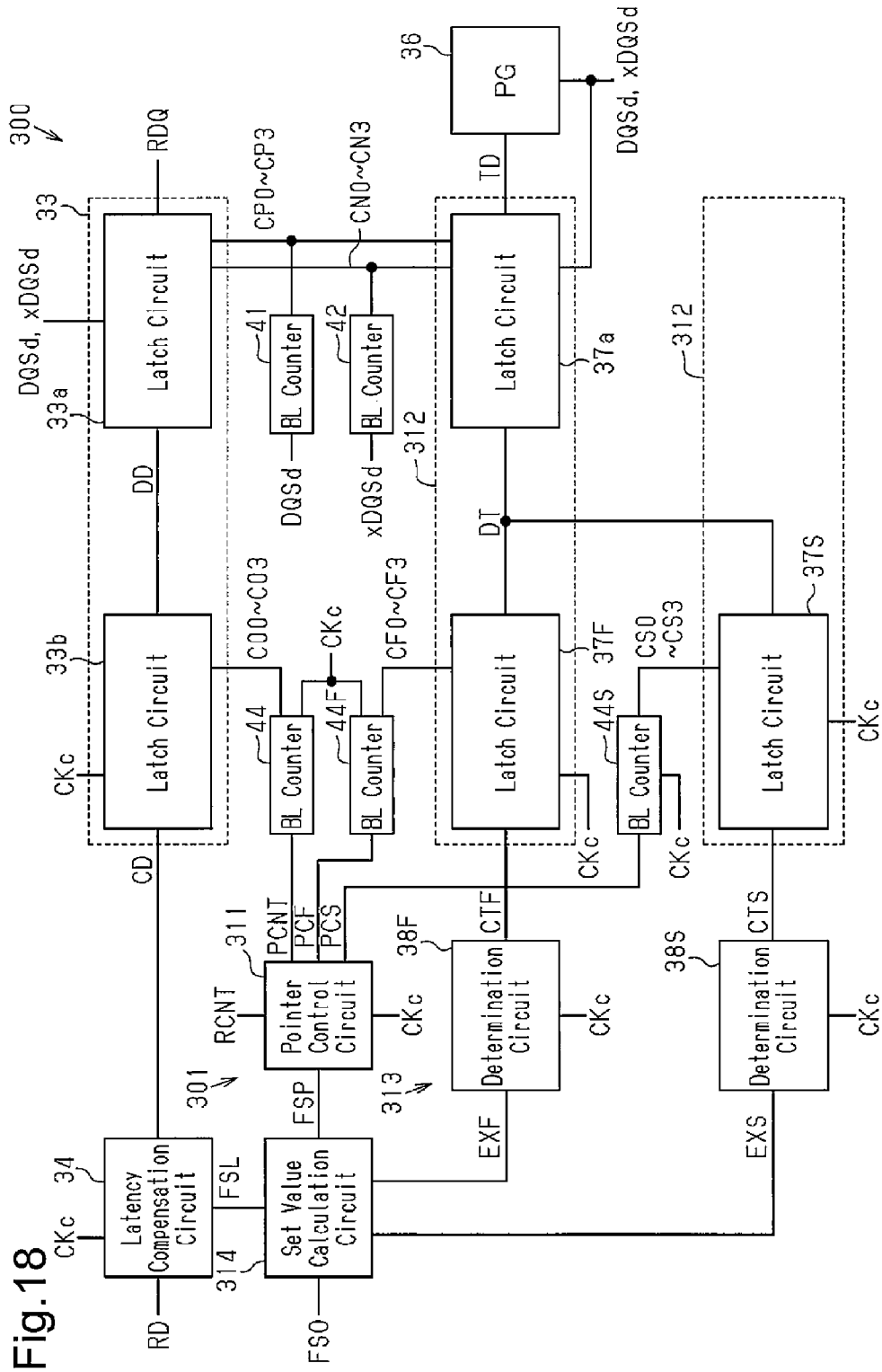
FIG. 18 is a schematic block diagram illustrating a portion of a second embodiment of a reception circuit.

FIG. 18 is a block diagram illustrating a portion of a second embodiment of a reception circuit 300.

The reception circuit 300 includes a control signal generation circuit 301 that includes a pointer control circuit 311. In the same manner as the pointer control circuit 43 of the first embodiment, the pointer control circuit 311 generates the pointer control signal PCNT by delaying the read control signal RCNT in accordance with the transfer set value FSP.

The pointer control circuit 311 also generates a fast control signal PCF that is changed at an earlier timing than the pointer control signal PCNT. The pointer control circuit 311 also generates a slow control signal PCS that is changed at a later timing than the pointer control signal PCNT.

For example, in the same manner as the pointer control circuit 43 illustrated in FIG. 4, the pointer control circuit 311 includes flip-flop (FF) circuits that are connected in series. The pointer control circuit 311 selects one of the FF circuits based on the transfer set value FSP and outputs an output signal of the selected FF circuit as the pointer control signal PCNT. The pointer control circuit 311 outputs an output signal of the FF circuit that is located in the preceding stage of the selected FF circuit as the fast control signal PCF. The change (e.g., rising edge) timing of the fast control signal PCF is advanced from the timing of the pointer control signal PCNT by one cycle of the core clock signal CKc.

The pointer control circuit 311 outputs an output signal of the FF circuit that is located in the following stage of the selected FF circuit as the slow control signal PCS. The change (e.g., rising edge) timing of the slow control signal PCS is retarded from the timing of the pointer control signal PCNT by one cycle of the core clock signal CKc.

Each of BL counters 44, 44F, 44S is a quaternary one-hot state counter including four FF circuits. The BL counter 44 enables the function based on the pointer control signal PCNT and generates the enable signals C00 to C03 by counting the core clock signals CKc. The BL counter 44F enables the function based on the fast control signal PCF and generates fast enable signals CF0 to CF3 by counting the core clock signals CKc. The BL counter 44S enables the function based on the slow control signal PCS and generates slow enable signals CS0 to CS3 by counting the core clock signals CKc.

A second asynchronous transfer circuit 312 includes the first latch circuit 37a and second latch circuits 37F, 37S. The first latch circuit 37a is one example of a third latch circuit. The second latch circuit 37F is one example of a fourth latch circuit. The second latch circuit 37S is one example of a fifth latch circuit. The fast enable signals CF0 to CF3 are provided to the second latch circuit 37F. The slow enable signals CS0 to CS3 are provided to the second latch circuit 37S.

The second latch circuit 37F enables the latch function based on the fast enable signals CF0 to CF3. The second latch circuit 37S latches the transfer signal DT at a rising edge of the core clock signal CKc and outputs fast determination data CTF. The second latch circuit 37S enables the latch function based on the slow enable signals CS0 to CS3. The second latch circuit 37S latches the transfer signal DT at a rising edge of the core clock signal CKc and outputs slow determination data CTS.

A determination circuit 313 includes a first determination circuit 38F and a second determination circuit 38S. The first determination circuit 38F is one example of a first determination circuit. The second determination circuit 38S is one example of a second determination circuit. In the same manner as the determination circuit 38 illustrated in FIG. 7, the first determination circuit 38F generates expected value data (first expected value data) based on the fast enable signal CF0. The determination circuit 38 compares (performs ExOR operation on) the first expected value data and the fast determination data CTF and generates a determination signal EXF. For example, in the same manner as the first embodiment, the second latch circuit 37F generates the determination data CT0, CT1 as the fast determination data CTF based on the fast enable signal CF0. The first determination circuit 38F compares (performs ExOR operation on) the determination data CT0, CT1 (fast determination data CTF) and the first expected value data. When the determination data CT0, CT1 are both "0," the first determination circuit 38F generates the determination signal EXF the value of which is "0." When at least one of the determination data CT0, CT1 is "1," the first determination circuit 38F generates the determination signal EXF the value of which is "1."

In the same manner as the first determination circuit 38F (i.e., same manner as determination circuit 38 illustrated in FIG. 7), the second determination circuit 38S generates the expected value data (second expected value data) based on the slow enable signal CS0. The determination circuit 38 compares (performs ExOR operation on) the second expected value data and the slow determination data CTS and generates a determination signal EXS.

The set value calculation circuit 314 determines whether the timing of the fast control signal PCF is "OK" or "NG" based on the determination signal EXF of the first determination circuit 38F. The set value calculation circuit 314 also determines whether the timing of the slow control signal PCS is "OK" or "NG" based on the determination signal EXS of the second determination circuit 38S. The set value calculation circuit 314 calculates the transfer set value FSP based on the two determination results. The set value calculation circuit 314 also calculates the latency set value FSL based on the transfer set value FSP.

Figure 19:
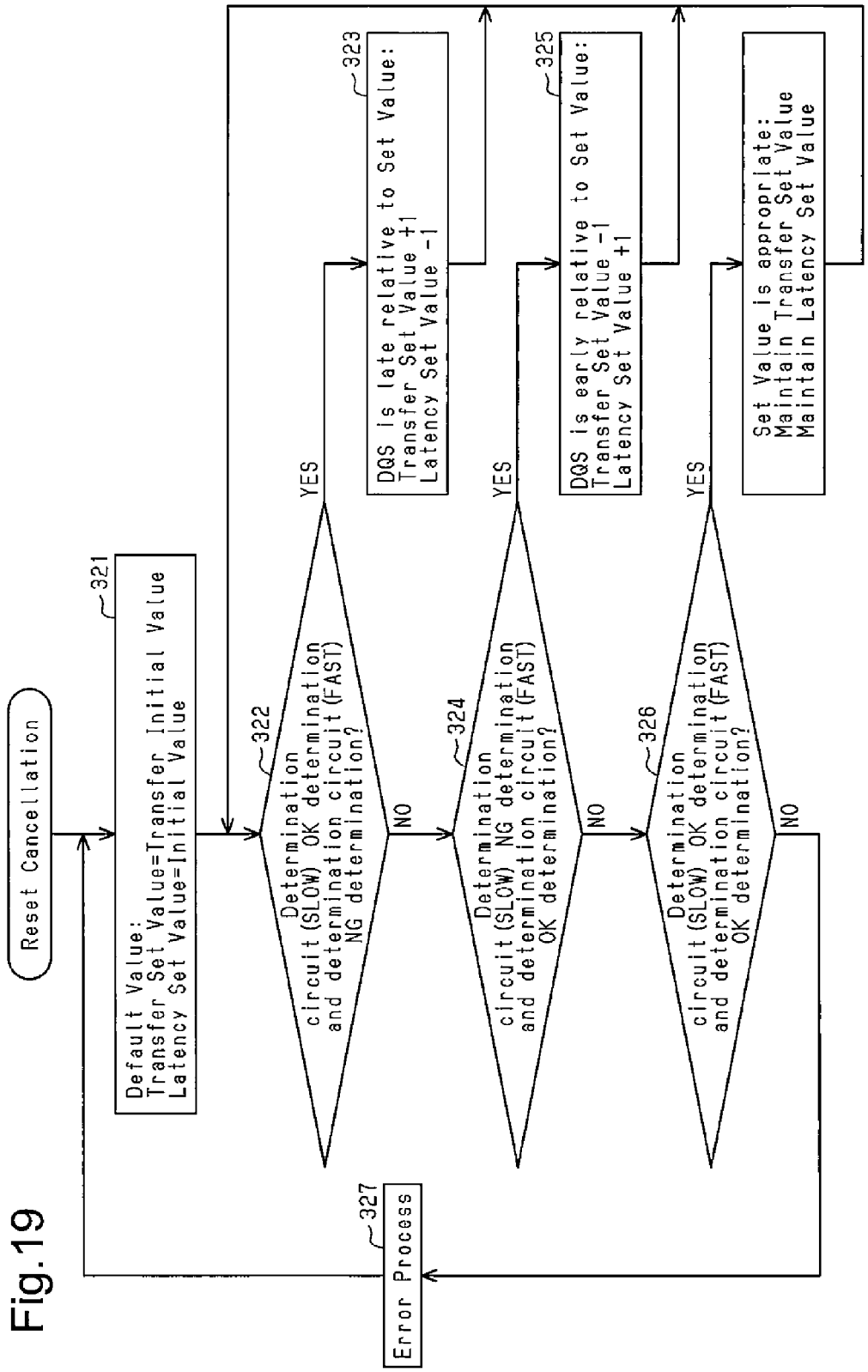
FIG. 19 is a schematic flowchart illustrating an operation of the set value calculation circuit illustrated in FIG. 18.

FIG. 19 illustrates the process performed by the set value calculation circuit 314.

In step 321, the set value calculation circuit 314 sets a default value. The set value calculation circuit 314 sets the default value of the transfer set value FSP to the transfer set value FSO, which is provided from the memory controller 21. The set value calculation circuit 314 also calculates a latency initial value corresponding to the transfer initial value FSO and sets the default value of the latency set value FSL to the latency initial value.

The set value calculation circuit 314 determines whether the first determination circuit 38F indicates "OK determination" or "NG determination" based on the determination signal EXF provided from the first determination circuit 38F illustrated in FIG. 18. The set value calculation circuit 314 also determines whether the second determination circuit 38S indicates "OK determination" or "NG determination" based on the determination signal EXS provided from the second determination circuit 38S illustrated in FIG. 18.

In step 322, when the second determination circuit 38S (SLOW) indicates "OK determination" and the first determination circuit 38F (FAST) indicates "NG determination," the set value calculation circuit 314 proceeds to step 323. The proceeding to step 323 is performed when "the DQS is late relative to the set value (clock replacement timing)." In step 323, the set value calculation circuit 314 adds "+1" to the transfer set value FSP and "−1" to the latency set value. The set value calculation circuit 314 proceeds to step 322.

In step 324, when the first determination circuit 38F indicates "OK determination" and the second determination circuit 38S indicates "NG determination," the set value calculation circuit 314 proceeds to step 325. The proceeding to step 325 is performed when "the DQS is early relative to the set value." In step 325, the set value calculation circuit 314 adds "−1" to the transfer set value FSP and "+1" to the latency set value FSL. The set value calculation circuit 314 proceeds to step 322.

In step 326, when the first determination circuit 38F indicates "OK determination" and the second determination circuit 38S indicates "OK determination," the set value calculation circuit 314 determines that "the DQS is appropriate to the set value." Thus, the set value calculation circuit 314 maintains the transfer set value FSP and the latency set value FSL and proceeds to step 322.

In step 326, when the first determination circuit 38F and the second determination circuit 38S both indicate "NG determination," the set value calculation circuit 314 proceeds to step 327. In step 327, the set value calculation circuit 314 executes the error process and proceeds to step 321. In the error process, the set value calculation circuit 314, for example, notifies error information to the memory controller 21 illustrated in FIG. 1. The memory controller 21 executes the training process based on the error information and resets the transfer set value FSP based on the process result.

The operation of the reception circuit 300 of the second embodiment will now be described.

The memory controller 21 illustrated in FIG. 1 executes the training process and sets a single transfer initial value FSO, for example, when the device 11 is activated. The set value calculation circuit 314 of the reception circuit 300 illustrated in FIG. 18 sets the transfer set value FSP to the transfer initial value FSO. The pointer control circuit 311 generates a pointer control signal PCNT that is delayed in accordance with the transfer set value FSP. The BL counter 44 generates the enable signals C00 to C03 based on the pointer control signal PCNT. The timing obtained based on the enable signal C00 is, for example, timing TP0 that is indicated by an arrow in FIG. 14.

The pointer control circuit 311 illustrated in FIG. 18 generates the fast control signal PCF, which is advanced from the pointer control signal PCNT by one cycle, and the slow control signal PCS, which is retarded from the pointer control signal PCNT by one cycle. The BL counter 44F generates the fast enable signals CF0 to CF3 based on the fast control signal PCF. The BL counter 44S generates the slow enable signals CS0 to CS3 based on the slow control signal PCS.

The timing obtained based on the fast enable signal CF0 is, for example, the timing (fast timing) of the rising edge of the core clock signal CKc that is advanced from timing TP0 illustrated in FIG. 14 by one cycle (leftward in FIG. 14). The timing obtained based on the slow enable signal CS0 is, for example, the timing (slow timing) of the rising edge of the core clock signal CKc that is retarded from timing TP0 illustrated in FIG. 14 by one cycle (rightward in FIG. 14).

For example, in FIG. 14, timing TP0 and the fast timing are in the range of the window W0, which corresponds to the data [A0] [B0] of the data DQ0. The slow timing is outside the range of the window W0. In this case, the delay strobe signal DQSd is early relative to the transfer set value FSP. Thus, the second determination circuit 38S illustrated in FIG. 18 outputs the determination signal EXS indicating "NG determination." The set value calculation circuit 314 adds "−1" to the transfer set value FSP to calculate a new transfer set value FSP based on the determination signal EXS. The BL counters 44, 44F, 44S each generate an enable signal at a timing that is advanced by one cycle based on the new transfer set value FSP. As a result, the three timings obtained based on the newly generated enable signals are all in the range of the window W0 illustrated in FIG. 14.

The second latch circuit 33b of the asynchronous transfer circuit 33 illustrated in FIG. 18 latches the output signal DD of the first latch circuit 33a based on the enable signals C00 to C03. At this time, the timing of the enable signal C00 is the middle one of the three timings set in the range of the window W0 illustrated in FIG. 14. Thus, the second latch circuit 33b illustrated in FIG. 18 latches the signal DD (DQ0) at a timing proximate to the middle of the window W0. That is, the reception circuit 300 sets the optimal timing for retrieving the data DQ0.

In FIG. 14, timing TP0 and the slow timing are in the range of the window W1, which corresponds to the data [A1] [B1] of the data DQ1. The fast timing is outside the range of the window W1. In this case, the delay strobe signal DQSd is late relative to the transfer set value FSP. Thus, the first determination circuit 38F illustrated in FIG. 18 outputs the determination signal EXF indicating "NG determination." The set value calculation circuit 314 adds "+1" to the transfer set value FSP to calculate a new transfer set value FSP based on the determination signal EXF. The BL counters 44, 44F, 44S each generate an enable signal at a timing that is retarded by one cycle based on the new transfer set value FSP. As a result, the three timings obtained based on the newly generated enable signals are all in the range of the window W1 illustrated in FIG. 14.

The second latch circuit 33b of the asynchronous transfer circuit 33 illustrated in FIG. 18 latches the output signal DD of the first latch circuit 33a based on the enable signals C00 to C03. At this time, the timing of the enable signal C00 is the middle one of the three timings set in the range of the window W1 illustrated in FIG. 14. Thus, the second latch circuit 33b illustrated in FIG. 18 latches the signal DD (DQ1) at a timing proximate to the middle of the window W1. That is, the reception circuit 300 sets the optimal timing for retrieving the data DQ1.

Figure 20:
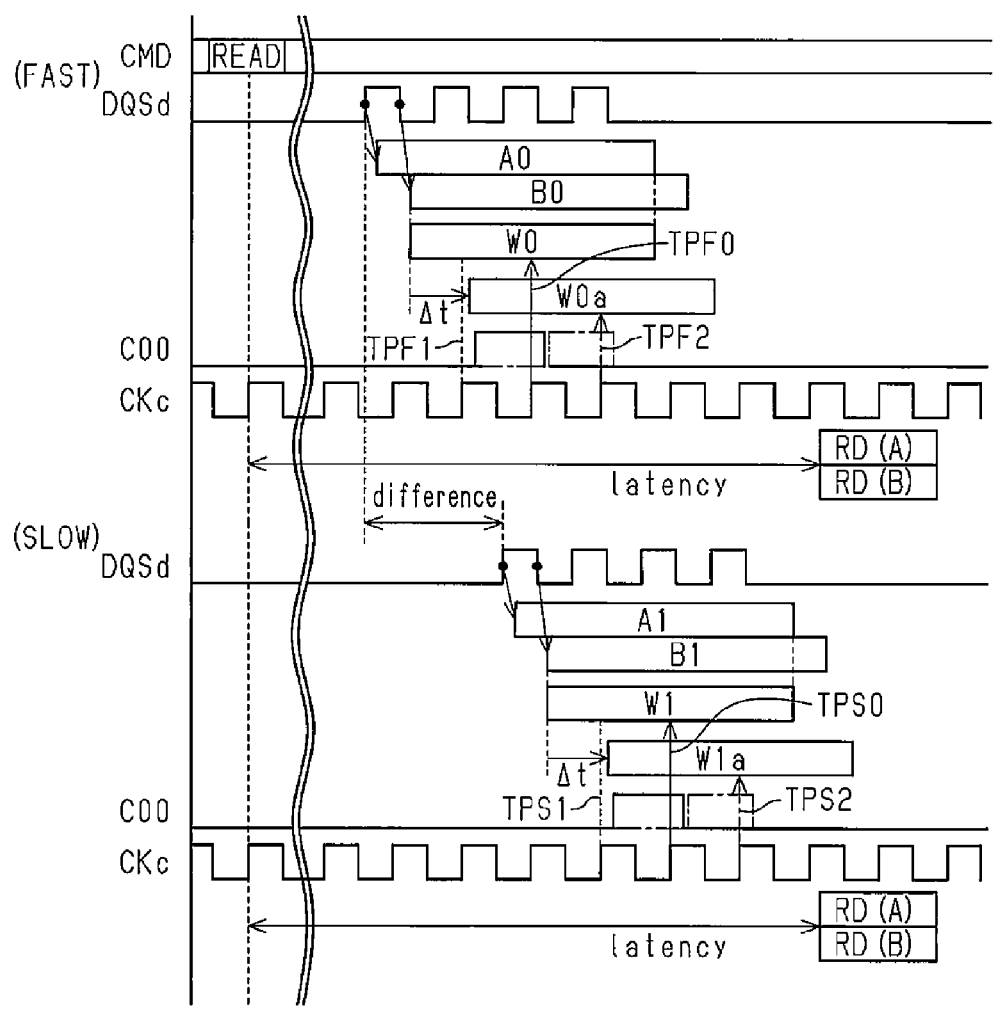
FIG. 20 is a schematic timing chart illustrating an operation of the reception circuit of the second embodiment.

As illustrated in FIG. 20, the data [A1] [B1] may be latched based on the delay strobe signal DQSd and the data DQ0 that are output when the round trip time (RTT) is the shortest (FAST). In this case, the VT drift may cause the window W0, which corresponds to the data [A0] [B0], to be timewise shifted by Δt to the window W0a. This displaces timing TPF1, which is advanced by one cycle from timing TPF0 that is set by the transfer set value FSP, out of the range of the window W0a. In this case, the delay strobe signal DQSd is late relative to the transfer set value FSP. Thus, the set value calculation circuit 314 adds "+1" to the transfer set value FSP to calculate a new transfer set value FSP based on the determination signals EXF, EXS. The timing for generating the enable signal C00 is retarded by one cycle of the core clock signal CKc (shifted rightward in FIG. 20) and adjusted to timing TPF2 based on the transfer set value FSP. The set value calculation circuit 314 also adds "−1" to the latency set value FSL to calculate a new latency set value FSL. Thus, the period from when the read command (READ) is issued to when the read data RD(A), RD(B) are output remains the same.

Also, as illustrated in FIG. 20, the data [A1] [B1] may be latched based on the delay strobe signal DQSd and the data DQ1 that are output when the round trip time (RTT) is the longest (SLOW). In this case, the VT drift may cause the window W1, which corresponds to the data [A1] [B1], to be timewise shifted by Δt to the window W1a. This displaces timing TPS1, which is advanced by one cycle from at timing TPS0 that is set by the transfer set value FSP, out of the window W1a. In this case, the delay strobe signal DQSd is late relative to the transfer set value FSP. Thus, the set value calculation circuit 314 adds "+1" to the transfer set value FSP to calculate a new transfer set value FSP based on the determination signals EXF, EXS. The timing for generating the enable signal C00 is retarded by one cycle of the core clock signal CKc (shifted rightward in FIG. 20) and adjusted to timing TPS2. The set value calculation circuit 314 also adds "−1" to the latency set value FSL to calculate a new latency set value FSL. Thus, the period from when the read command (READ) is issued to when the read data RD(A), RD(B) are output remains the same.

The second embodiment has the advantages described below.

(2-1) The pointer control circuit 311 delays the read control signal RCNT and generates the pointer control signal PCNT in accordance with the transfer set value FSP. The pointer control circuit 311 generates the fast control signal PCF, which is changed at an earlier timing than the pointer control signal PCNT. Additionally, the pointer control circuit 311 generates the slow control signal PCS, which is changed at a later timing than the pointer control signal PCNT.

The BL counter 44 generates the enable signals C00 to C03 based on the pointer control signal PCNT. The BL counter 44F generates the fast enable signals CF0 to CF3 based on the fast control signal PCF. The BL counter 44S generates the slow enable signals CS0 to CS3 based on the slow control signal PCS. The second latch circuit 37F latches the transfer signal DT received from the first latch circuit 37a and outputs the fast determination data CTF in accordance with the fast enable signals CF0 to CF3. The second latch circuit 37b latches the transfer signal DT received from the first latch circuit 37a and outputs the slow determination data CTS in accordance with the slow enable signals CS0 to CS3. The first determination circuit 38F generates the determination signal EXF based on the fast determination data CTF. The second determination circuit 38S generates the determination signal EXS based on the slow determination data CTS. The set value calculation circuit 314 calculates the transfer set value FSP based on the determination results of the first determination circuit 38F and the second determination circuit 38S. The transfer set value FSP substantially sets the pointer control signal PCNT in the middle of the window for retrieving the reception data RDQ. This sets the optimal pointer control signal PCNT for the window of the reception data RDQ.

(2-2) The set value calculation circuit 314 calculates the transfer set value FSP based on the determination signal EXF of the first determination circuit 38F and the determination signal EXS of the second determination circuit 38S and adjusts the timing of the pointer control signal PCNT based on the transfer set value FSP. The timing determined by the first determination circuit 38F is advanced from the timing of the pointer control signal PCNT, or a timing when the asynchronous transfer circuit 33 changes the domain. The timing determined by the second determination circuit 38S is retarded from the timing of the pointer control signal PCNT, or the timing when the asynchronous transfer circuit 33 changes the domain. Thus, the timing of the pointer control signal PCNT is always in the range of the window of the data DQ. This reduces errors in the read data RD.

It should be apparent to those skilled in the art that the foregoing embodiments may be employed in many other specific forms without departing from the scope of this disclosure. Particularly, it should be understood that the foregoing embodiments may be employed in the following forms.

In each embodiment, in the same manner as the asynchronous transfer circuit 33, the asynchronous transfer circuit 37 includes the FF circuits 810 to 817, 820 to 827. However, as described in each embodiment, the timing may be determined using the determination signals EX0, EX1. Thus, in FIG. 6, the asynchronous transfer circuit 37 only needs to include at least the FF circuits 810, 811, 820, 821. In accordance with this change, in FIG. 7, the determination circuit 38 only needs to include at least the ExOR circuits 920, 921.

In each embodiment, the burst length is set to "8." Instead, the burst length may be set to another value.

In each embodiment, the minimum window width is determined. As described in each embodiment, the minimum window width is a window width that allows for the domain change of the data DQ when the data DQ is continuously retrieved. When intermittently accessing the memory 12, two or more consecutive read accesses may be performed by continuous read operations (e.g., command exchange or dummy read command). This determines the window width and allows for the timing adjustment.

In each embodiment, the memory controller 21 performs the training operation that adjusts the timing for outputting the data DQ or the like. However, the memory controller 21 does not have to have the function of the training operation.

In each embodiment, the memory controller 21 performs the training operation. Instead, another circuit, for example, the core circuit may perform the training operation.

All examples and conditional language recited herein are intended for pedagogical purposes to aid the reader in understanding the principles of this disclosure and the concepts contributed by the inventors to furthering the art, and are to be construed as being without limitation to such specifically recited examples and conditions, nor does the organization of such examples in the specification relate to an illustration of the superiority and inferiority of the disclosure. Although embodiments have been described in detail, it should be understood that various changes, substitutions, and alterations could be made hereto without departing from the spirit and scope of this disclosure.

The invention claimed is:

1. A reception circuit comprising:
   a control signal generation circuit that generates
      a first enable signal based on a strobe signal,
      a pointer control signal based on a read control signal, a transfer set value, and a core clock signal, and
      a second enable signal based on the pointer control signal and the core clock signal;
   a first asynchronous transfer circuit that latches reception data based on the first enable signal and the strobe signal and outputs output data corresponding to the latched reception data based on the second enable signal and the core clock signal;
   a pattern data generation circuit that generates determination pattern data from the first enable signal and inverts a logic of the determination pattern data in accordance with a change in the first enable signal;
   a second asynchronous transfer circuit that latches the determination pattern data based on the first enable signal and the strobe signal and outputs determination data corresponding to the latched determination pattern data based on the second enable signal and the core clock signal;
   a determination circuit that determines a timing for generating the pointer control signal based on the determination data output from the second asynchronous transfer circuit; and
   a set value calculation circuit that calculates the transfer set value based on a determination result of the determination circuit.

2. The reception circuit according to claim 1, further comprising a latency compensation circuit that outputs read data by delaying the output data of the first asynchronous transfer circuit based on a latency set value, wherein the set value calculation circuit calculates the latency set value based on the transfer set value.

3. The reception circuit according to claim 1, wherein the determination circuit generates expected value data based on the second enable signal and determines the timing for generating the pointer control signal by comparing the expected value data with the determination data output from the second asynchronous transfer circuit.

4. The reception circuit according to claim 1, wherein:
   the first enable signal generated by the control signal generation circuit includes
      a positive phase enable signal that is generated based on the strobe signal, and
      a negative phase enable signal that is generated based on an inverse strobe signal having an inverse logic of the strobe signal;
   the pattern data generation circuit generates first determination pattern data based on the positive phase enable signal and second determination pattern data based on the negative phase enable signal;
   the second asynchronous transfer circuit outputs first determination data and second determination data by transferring the first determination pattern data and the second determination pattern data, respectively;
   the determination circuit generates expected value data based on the second enable signal, generates a first determination signal by comparing the first determination data with the expected value data, and generates a second determination signal by comparing the second determination data with the expected value data; and
   the set value calculation circuit calculates the transfer set value based on the first determination signal and the second determination signal.

5. The reception circuit according to claim 1, wherein:
   the control signal generation circuit generates, based on the transfer set value, a fast enable signal changing at an earlier timing than the second enable signal and a slow enable signal changing at a later timing than the second enable signal;

the first asynchronous transfer circuit includes
a first latch circuit that latches the reception data based on the first enable signal, and
a second latch circuit that latches an output signal of the first latch circuit based on the second enable to outputs the output data;

the second asynchronous transfer circuit includes
a third latch circuit that latches the determination pattern data based on the first enable signal,
a fourth latch circuit that latches an output signal of the third latch circuit based on the fast enable signal, and
a fifth latch circuit that latches the output signal of the third latch circuit based on the slow enable signal;

the determination circuit includes
a first determination circuit that generates first expected value data based on the fast enable signal and compares the first expected value data with an output signal of the fourth latch circuit to determine a timing of the fast enable signal, and
a second determination circuit that generates second expected value data based on the slow enable signal and compares the second expected value data with an output signal of the fifth latch circuit to determine a timing of the slow enable signal; and the set value calculation circuit calculates the transfer set value based on a determination result of the first determination circuit and a determination result of the second determination circuit.

6. A method for adjusting a timing in a reception circuit, the method comprising:
generating a first enable signal based on a strobe signal;
generating a pointer control signal based on a read control signal, a transfer set value, and a core clock signal;
generating a second enable signal based on the pointer control signal and the core clock signal, wherein the reception circuit latches reception data based on the first enable signal and the strobe signal and outputs output data corresponding to the latched reception data based on the second enable signal and the core clock signal;
generating determination pattern data from the first enable signal, wherein the generating determination pattern data includes inverting a logic of the determination pattern data in accordance with a change in the first enable signal;
latching the determination pattern data based on the first enable signal and the strobe signal;
outputting determination data corresponding to the latched determination pattern data based on the second enable signal and the core clock signal;
determining a timing for generating the pointer control signal based on the determination data to generate a determination signal;
updating the transfer set value based on the determination signal; and
updating the pointer control signal based on the updated transfer set value to adjust a timing for changing a domain from the strobe signal to the core clock signal.

7. A semiconductor device comprising:
a memory controller that generates a read control signal to control access to a memory; and
a reception circuit that delays a strobe signal output from the memory to generate a delay strobe signal and transfers read data to the memory controller by retrieving reception data from the memory based on the delay strobe signal and a core clock signal, wherein the reception circuit includes a control signal generation circuit that generates
a first enable signal based on the delay strobe signal,
a pointer control signal based on the read control signal, a transfer set value, and the core clock signal, and
a second enable signal based on the pointer control signal and the core clock signal, a first asynchronous transfer circuit that latches the reception data based on the first enable signal and the delay strobe signal and outputs output data corresponding to the latched reception data based on the second enable signal and the core clock signal, a pattern data generation circuit that generates determination pattern data from the first enable signal and inverts a logic of the determination pattern data in accordance with a change in the first enable signal, a second asynchronous transfer circuit that latches the determination pattern data based on the first enable signal and the delay strobe signal and outputs determination data corresponding to the latched determination pattern data based on the second enable signal and the core clock signal, a determination circuit that determines a timing for generating the pointer control signal based on the determination data output from the second asynchronous transfer circuit, and a set value calculation circuit that calculates the transfer set value based on a determination result of the determination circuit.

* * * * *